United States Patent
Huang

(10) Patent No.: US 11,935,834 B2
(45) Date of Patent: Mar. 19, 2024

(54) METHOD FOR PREPARING SEMICONDUCTOR DEVICE WITH CONTACT STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/217,719

(22) Filed: Jul. 3, 2023

(65) Prior Publication Data

US 2023/0343841 A1 Oct. 26, 2023

Related U.S. Application Data

(62) Division of application No. 17/347,136, filed on Jun. 14, 2021, now Pat. No. 11,749,730.

(51) Int. Cl.
| | |
|---|---|
| H01L 23/532 | (2006.01) |
| H01L 21/768 | (2006.01) |
| H01L 29/417 | (2006.01) |
| H01L 29/45 | (2006.01) |
| H01L 29/78 | (2006.01) |
| H01L 29/80 | (2006.01) |
| H01L 29/40 | (2006.01) |

(52) U.S. Cl.
CPC .. H01L 23/53271 (2013.01); H01L 21/76877 (2013.01); H01L 29/41725 (2013.01); H01L 29/41775 (2013.01); H01L 29/45 (2013.01); H01L 29/458 (2013.01); H01L 29/7839 (2013.01); H01L 29/806 (2013.01); *H01L 29/401* (2013.01)

(58) Field of Classification Search
CPC ......... H01L 23/53271; H01L 21/76877; H01L 29/41725; H01L 29/41775; H01L 29/45; H01L 29/458; H01L 29/7839; H01L 29/806
See application file for complete search history.

(56) References Cited

U.S. PATENT DOCUMENTS

| | | | | |
|---|---|---|---|---|
| 5,326,722 | A | * | 7/1994 | Huang .............. H01L 21/28525 257/E21.59 |
| 2020/0083249 | A1 | * | 3/2020 | Matsuura ............... H10B 43/27 |

* cited by examiner

*Primary Examiner* — Joseph C. Nicely
(74) *Attorney, Agent, or Firm* — Xuan Zhang

(57) ABSTRACT

The present disclosure relates to a semiconductor device with a contact structure and a method for preparing the semiconductor device. The semiconductor device includes a source/drain structure disposed over a semiconductor substrate, and a dielectric layer disposed over the source/drain structure. The semiconductor device also includes a polysilicon stack disposed over the source/drain structure and surrounded by the dielectric layer. The polysilicon stack includes a first polysilicon layer and a second polysilicon layer disposed over the first polysilicon layer. The first polysilicon layer is undoped, and the second polysilicon layer is doped. The semiconductor device further includes a contact structure disposed directly over the polysilicon stack and surrounded by the dielectric layer.

7 Claims, 24 Drawing Sheets

METHOD FOR PREPARING SEMICONDUCTOR DEVICE WITH CONTACT STRUCTURE

CROSS-REFERENCE TO RELATED APPLICATION

This application is a divisional application of U.S. Non-Provisional application Ser. No. 17/347,136 filed 14 Jun. 2021, which is incorporated herein by reference in its entirety.

TECHNICAL FIELD

The present disclosure relates to a semiconductor device and a method for preparing the same, and more particularly, to a semiconductor device with a contact structure and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a source/drain structure disposed over a semiconductor substrate, and a dielectric layer disposed over the source/drain structure. The semiconductor device also includes a polysilicon stack disposed over the source/drain structure and surrounded by the dielectric layer. The polysilicon stack includes a first polysilicon layer and a second polysilicon layer disposed over the first polysilicon layer. The first polysilicon layer is undoped, and the second polysilicon layer is doped. The semiconductor device further includes a contact structure disposed directly over the polysilicon stack and surrounded by the dielectric layer.

In an embodiment, the second polysilicon layer is doped with arsenic (As), boron (B), or phosphorous (P). In an embodiment, the polysilicon stack further includes a third polysilicon layer disposed over the second polysilicon layer, and a fourth polysilicon layer disposed over the third polysilicon layer. The third polysilicon layer is undoped, and the fourth polysilicon layer is doped. In an embodiment, a dopant concentration of the second polysilicon layer is greater than a dopant concentration of the fourth polysilicon layer. In an embodiment, the second polysilicon layer is separated from the dielectric layer by the first polysilicon layer. In an embodiment, the second polysilicon layer is in direct contact with the dielectric layer. In an embodiment, the contact structure comprises a barrier layer and a conductive layer disposed over and surrounded by the barrier layer, and wherein the barrier layer includes titanium (Ti), titanium nitride (TiN), or a combination thereof, and the conductive layer includes tungsten (W).

In an embodiment, the barrier layer has a lower portion surrounded by the polysilicon stack. In an embodiment, the source/drain structure includes an epitaxial layer and a silicide layer disposed over the epitaxial layer. In an embodiment, the silicide layer includes cobalt silicide. In an embodiment, the semiconductor device further includes a gate structure penetrating through the dielectric layer, the silicide layer, and the epitaxial layer, wherein the gate structure extends into the semiconductor substrate, and the gate structure is adjacent to the polysilicon stack and the contact structure. In an embodiment, the semiconductor device further includes a gate structure penetrating through the dielectric layer and the epitaxial layer, wherein the gate structure extends into the semiconductor substrate, and the gate structure is separated from the silicide layer by the dielectric layer.

In another embodiment of the present disclosure, a semiconductor device is provided. The semiconductor device includes a source/drain structure disposed over a semiconductor substrate, and a dielectric layer disposed over the source/drain structure. The semiconductor device also includes a contact structure penetrating through the dielectric layer and the source/drain structure. The contact structure includes a conductive layer and a barrier layer covering a sidewall and a bottom surface of the conductive layer. A first thickness of the barrier layer on the sidewall of the conductive layer is less than a second thickness of the barrier layer under the bottom surface of the conductive layer.

In an embodiment, the first thickness is along a first direction, and the second thickness is along a second direction perpendicular to the first direction. In an embodiment, the contact structure extends into the semiconductor substrate. In an embodiment, the barrier layer includes titanium (Ti), titanium nitride (TiN), or a combination thereof, and the conductive layer includes tungsten (W). In an embodiment, the source/drain structure includes an epitaxial layer and a silicide layer disposed over the epitaxial layer. In an embodiment, the silicide layer includes cobalt silicide.

In another embodiment of the present disclosure, a method for preparing a semiconductor device is provided. The method includes forming an epitaxial layer over a semiconductor substrate, and forming a dielectric layer over the epitaxial layer. The method also includes etching the dielectric layer to form an opening, and forming a polysilicon stack in the opening, the step of forming the polysilicon stack includes forming a first polysilicon layer, and forming a second polysilicon layer over the first polysilicon layer. The first polysilicon layer is undoped, and the second polysilicon layer is doped. The method further includes forming a contact structure in the opening and over the polysilicon stack.

In an embodiment, the method further includes forming a gate structure penetrating through the dielectric layer and the epitaxial layer, wherein the gate structure extends into the semiconductor substrate, and the gate structure is formed before the opening is formed. In an embodiment, the step of forming the polysilicon stack further includes forming a third polysilicon layer over the second polysilicon layer, and forming a fourth polysilicon layer over the third polysilicon layer. The third polysilicon layer is undoped, and the fourth polysilicon layer is doped. In an embodiment, a dopant concentration of the second polysilicon layer is greater than a dopant concentration of the fourth polysilicon layer.

In an embodiment, the step of forming the contact structure includes forming a barrier layer lining the opening and over the polysilicon stack, and filling a remaining portion of the opening with a conductive layer after the barrier layer is formed, wherein the conductive layer is separated from the polysilicon stack by the barrier layer. In an embodiment, the method further includes forming a silicide layer between the epitaxial layer and the dielectric layer before the opening is formed, wherein a top surface of the silicide layer is exposed by the opening before the polysilicon stack is formed. In an embodiment, a top surface of the epitaxial layer is exposed by the opening before the polysilicon stack is formed, and a silicide layer is formed between the epitaxial layer and the polysilicon stack during the forming of the first polysilicon layer.

In yet another embodiment of the present disclosure, a method for preparing a semiconductor device is provided. The method includes forming a source/drain structure over a semiconductor substrate, and forming a dielectric layer over the source/drain structure. The method also includes etching the dielectric layer and the source/drain structure to form an opening, and forming a conductive contact in the opening. The step of forming the conductive contact includes performing an anisotropic deposition process to form a barrier layer covering a sidewall and a bottom surface of the opening, and filling a remaining portion of the opening with a conductive layer after the barrier layer is formed.

In an embodiment, the anisotropic deposition process includes a physical vapor deposition (PVD) process. In an embodiment, a first thickness of the barrier layer on the sidewall of the opening is less than a second thickness of the barrier layer on the bottom surface of the opening. The first thickness is along a first direction, and the second thickness is along a second direction perpendicular to the first direction. In an embodiment, the source/drain structure includes an epitaxial layer and a silicide layer over the epitaxial layer, and the opening penetrates through the silicide layer and the epitaxial layer. In an embodiment, the opening extends into the semiconductor substrate.

Embodiments of a semiconductor device and method for preparing the same are provided in the disclosure. In some embodiments, the semiconductor device includes a polysilicon stack disposed over a source/drain structure, and a contact structure disposed directly over the polysilicon stack. The polysilicon stack includes an undoped polysilicon layer and a doped polysilicon layer disposed over the undoped polysilicon layer. By forming the polysilicon stack between the contact structure and the source/drain structure, contact resistance may be reduced, and this improves device performance. In addition, in some embodiments, the semiconductor device includes a conductive structure having a barrier layer and a conductive layer disposed over and surrounded by the barrier layer. The barrier layer has a first thickness on the sidewall of the conductive layer, and a second thickness under the bottom surface of the conductive layer. Since the first thickness is less than the second thickness, the conductive layer can be formed void-free, and this improves device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
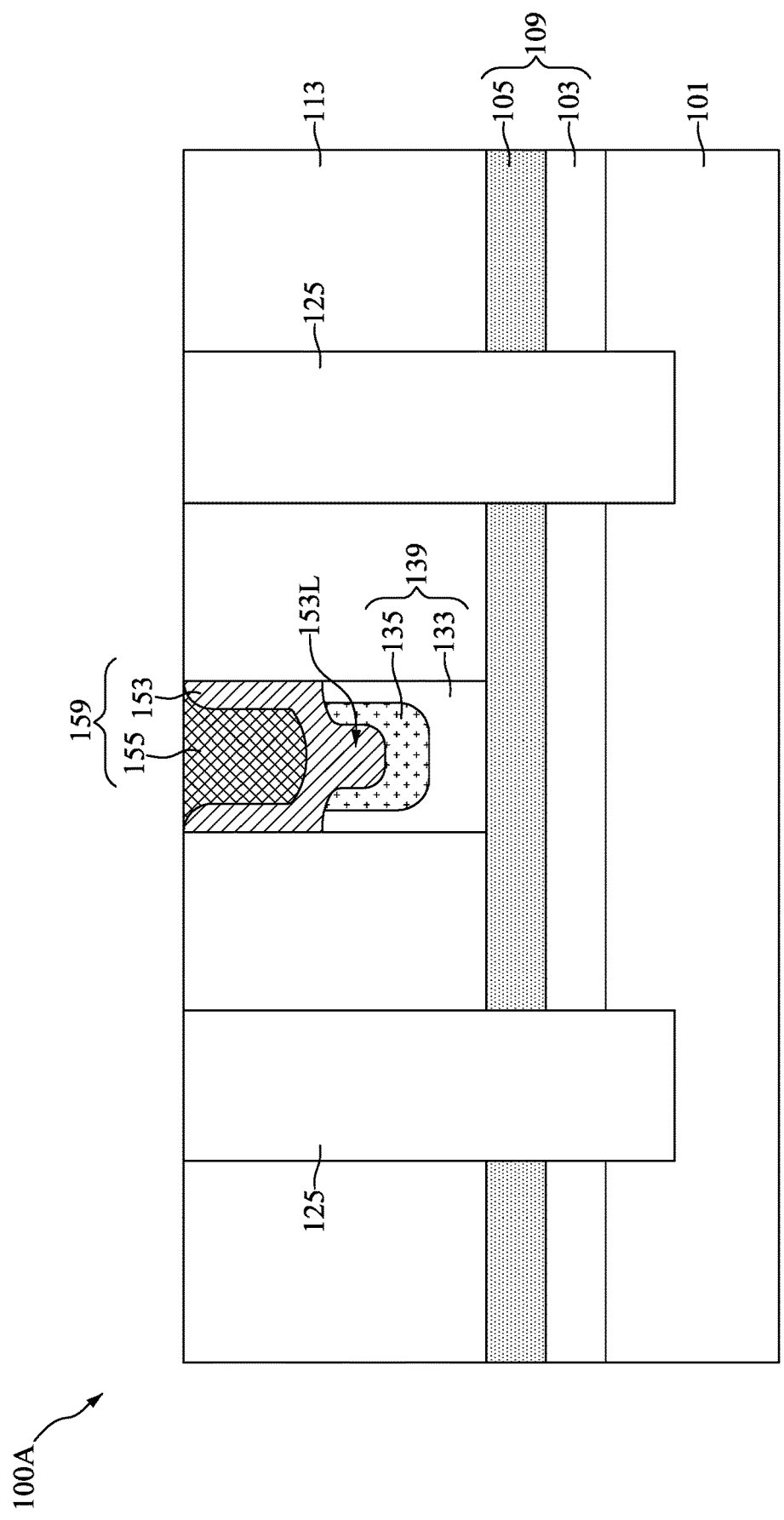
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100A, in accordance with some embodiments. In some embodiments, the semiconductor device 100A includes a source/drain structure 109 disposed over a semiconductor substrate 101, and a dielectric layer 113 disposed over the source/drain structure 109. The source/drain structure 109 includes an epitaxial layer 103 and a silicide layer 105 disposed over the epitaxial layer 103. In some embodiments, the epitaxial layer 103 is entirely covered by the silicide layer 105, such that the epitaxial layer 103 is separated from the dielectric layer 113 by the silicide layer 109. In some embodiments, the epitaxial layer 103 includes silicon (Si), and the silicide layer 105 includes cobalt silicide ($CoSi_x$).

Moreover, the semiconductor device 100A also includes gate structures 125 penetrating through the dielectric layer 113, the silicide layer 105 and the epitaxial layer 103. In some embodiments, the gate structures 125 extend into the semiconductor substrate 101. In some embodiments, the semiconductor device 100A further includes a polysilicon stack 139 disposed in the dielectric layer 113 and over the source/drain structure 109, and a contact structure 159 disposed directly over the polysilicon stack 139. In some embodiments, the polysilicon stack 139 and the contact structure 159 are surrounded by the dielectric layer 113. In some embodiments, the polysilicon stack 139 and the contact structure 159 are disposed between the gate structures 125.

The polysilicon stack 139 includes a first polysilicon layer 133 and a second polysilicon layer 135 disposed over and surrounded by the first polysilicon layer 133. In some embodiments, the second polysilicon layer 135 is separated from the dielectric layer 113 by the first polysilicon layer 133. It should be noted that the first polysilicon layer 133 is undoped, and the second polysilicon layer 135 is doped, in accordance with some embodiments. In some embodiments, the second polysilicon layer 135 is doped with arsenic (As), boron (B), or phosphorous (P).

In addition, in some embodiments, the contact structure 159 includes a barrier layer 153 and a conductive layer 155 disposed over and surrounded by the barrier layer 153. In some embodiments, the barrier layer 153 includes titanium (Ti), titanium nitride (TiN), or a combination thereof, and the conductive layer 155 includes tungsten (W). In some embodiments, the conductive layer 155 is separated from the polysilicon stack 139 by the barrier layer 153. In some embodiments, the barrier layer 153 has a lower portion 153L surrounded by the polysilicon stack 139. In some embodiments, the contact structure 159 is electrically connected to the source/drain structure 109 by the polysilicon stack 139. In some embodiments, the semiconductor device 100A is part of dynamic random access memory (DRAM).

Figure 2:
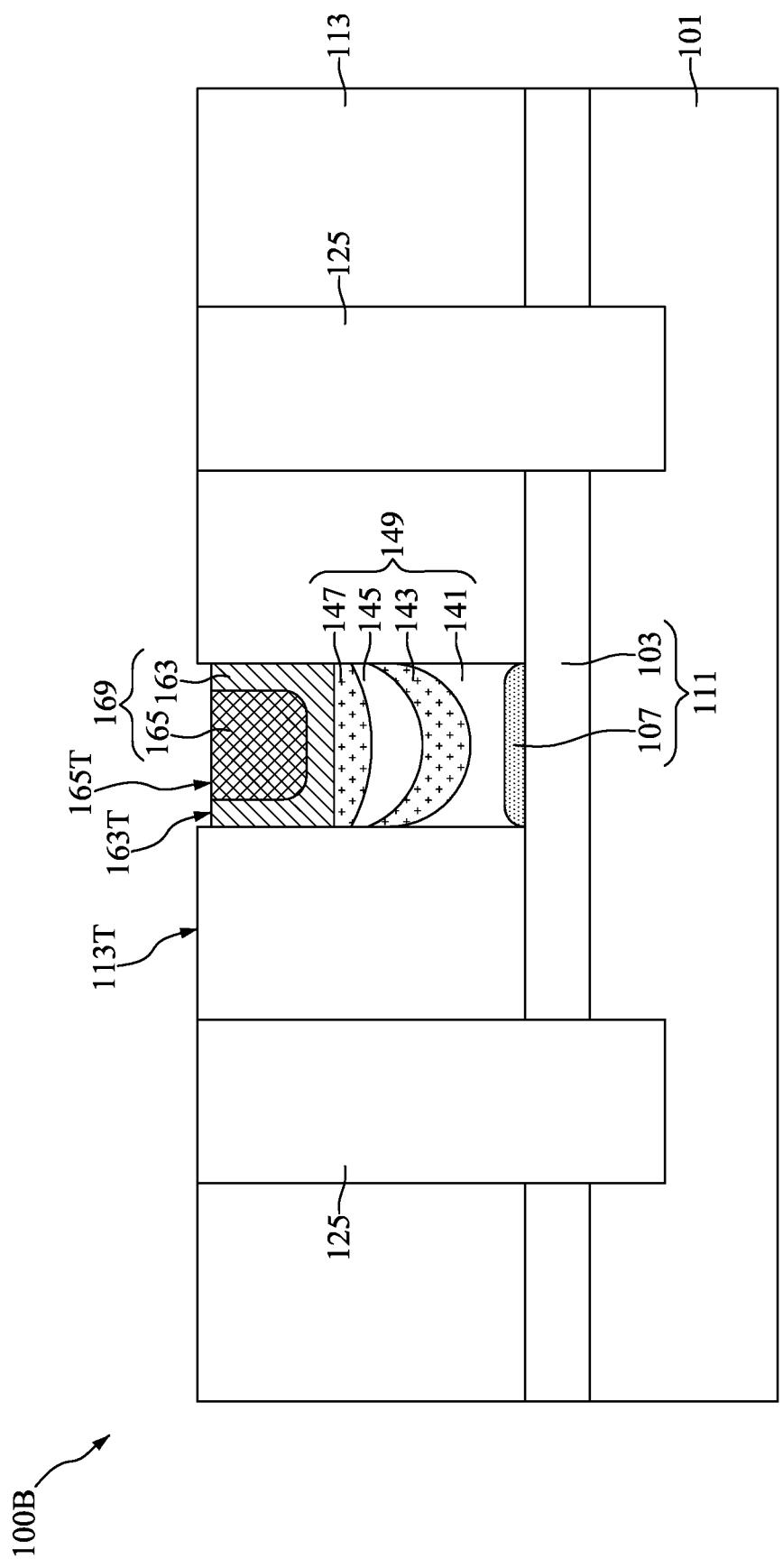
FIG. 2 is a cross-sectional view illustrating a semiconductor device, in accordance with some embodiments.

FIG. 2 is a cross-sectional view illustrating a semiconductor device 100B, in accordance with some embodiments. Semiconductor device 100B may be similar to the semiconductor device 100A, where same reference numbers refer to the same elements, and certain details or descriptions of the same elements are not repeated.

In some embodiments, the semiconductor device 100B includes a source/drain structure 111 disposed over a semiconductor substrate 101, and a dielectric layer 113 disposed over the source/drain structure 111. Specifically, the source/drain structure 111 includes an epitaxial layer 103 and a silicide layer 107 disposed over the epitaxial layer 103. It should be noted that the silicide layer 111 partially covers the epitaxial layer 107, and the other portion of the epitaxial layer 107 not covered by the silicide layer 111 is covered by the dielectric layer 113, which is different from the semiconductor device 100A. In some embodiments, the epitaxial layer 103 includes silicon (Si), and the silicide layer 105 includes cobalt silicide ($CoSi_x$).

Moreover, the semiconductor device 100B also includes gate structures 125 penetrating through the dielectric layer 113 and the epitaxial layer 103. In some embodiments, the gate structures 125 extend into the semiconductor substrate 101. In some embodiments, the semiconductor device 100B further includes a polysilicon stack 149 disposed in the dielectric layer 113 and over the silicide layer 107 of the source/drain structure 111, and a contact structure 169 disposed directly over the polysilicon stack 149. In some embodiments, the polysilicon stack 149 and the contact structure 169 are surrounded by the dielectric layer 113. In some embodiments, the polysilicon stack 149 and the contact structure 169 are disposed between the gate structures 125.

In some embodiments, the polysilicon stack 149 includes a first polysilicon layer 141, a second polysilicon layer 143 disposed over the first polysilicon layer 141, a third polysilicon layer 145 disposed over the second polysilicon layer 143, and a fourth polysilicon layer 147 disposed over the third polysilicon layer 145. In some embodiments, each of the first polysilicon layer 141, the second polysilicon layer 143, the third polysilicon layer 145 and the fourth polysilicon layer 147 is in direct contact with the dielectric layer 113.

It should be noted that the first polysilicon layer 141 and the third polysilicon layer 145 are undoped, and the second polysilicon layer 143 and the fourth polysilicon layer 147 are doped. In some embodiments, a dopant concentration of the second polysilicon layer 143 is greater than a dopant concentration of the fourth polysilicon layer 147. In some embodiments, the second polysilicon layer 143 and the fourth polysilicon layer 147 are doped with arsenic (As), boron (B), or phosphorous (P). In some embodiments, each of the first polysilicon layer 141, the second polysilicon layer 143 and the third polysilicon layer 145 has a concave top surface facing the contact structure 169. In some embodiments, the first polysilicon layer 141, the second polysilicon layer 143 and the third polysilicon layer 145 have U-shaped or V-shaped profiles.

In addition, in some embodiments, the contact structure 169 includes a barrier layer 163 and a conductive layer 165 disposed over and surrounded by the barrier layer 163. In some embodiments, the barrier layer 163 includes titanium (Ti), titanium nitride (TiN), or a combination thereof, and the conductive layer 165 includes tungsten (W). In some embodiments, the conductive layer 165 is separated from the polysilicon stack 149 by the barrier layer 163. In some embodiments, the contact structure 169 is electrically connected to the source/drain structure 111 by the polysilicon stack 149. In some embodiments, the top surface 113T of the dielectric layer 113 is higher than the top surface 163T of the barrier layer 163 and the top surface 165T of the conductive layer 165. Moreover, the top surface 163T of the barrier layer 163 is substantially coplanar with the top surface 165T of the conductive layer 165. In some embodiments, the semiconductor device 100B is part of dynamic random access memory (DRAM).

Figure 3:
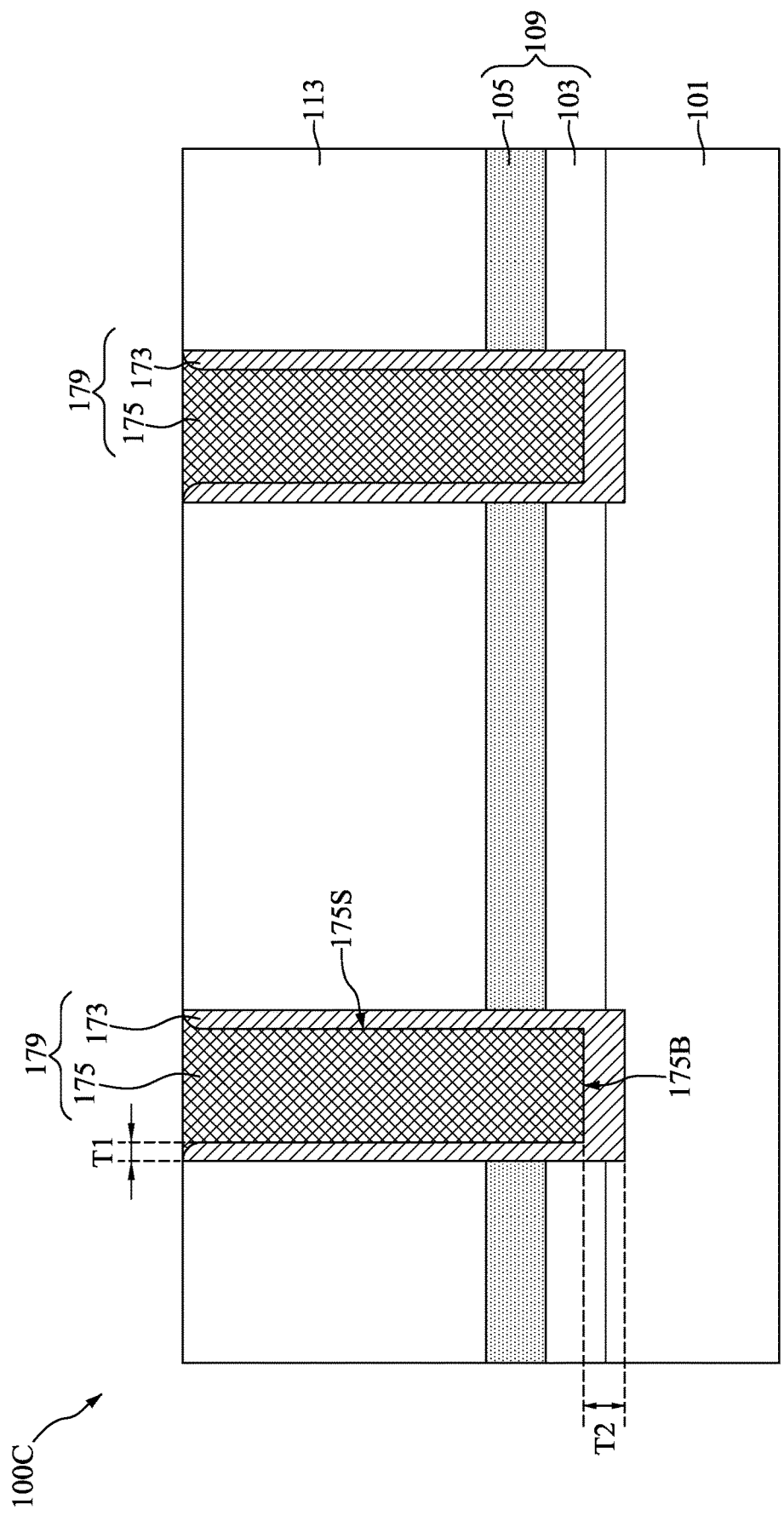
FIG. 3 is a cross-sectional view illustrating a semiconductor device, in accordance with some embodiments.

FIG. 3 is a cross-sectional view illustrating a semiconductor device 100C, in accordance with some embodiments. Semiconductor device 100C may be similar to the semiconductor device 100A, where same reference numbers refer to the same elements, and certain details or descriptions of the same elements are not repeated.

In some embodiments, the semiconductor device 100C includes a source/drain structure 109 disposed over a semiconductor substrate 101, and a dielectric layer 113 disposed over the source/drain structure 109. The source/drain structure 109 includes an epitaxial layer 103 and a silicide layer 105 disposed over the epitaxial layer 103. In some embodiments, the epitaxial layer 103 is entirely covered by the silicide layer 105, such that the epitaxial layer 103 is separated from the dielectric layer 113 by the silicide layer 109. In some embodiments, the epitaxial layer 103 includes silicon (Si), and the silicide layer 105 includes cobalt silicide ($CoSi_x$).

Moreover, the semiconductor device 100C also includes contact structures 179 penetrating through the dielectric layer 113, the silicide layer 105 and the epitaxial layer 103. In some embodiments, the contact structures 179 extend into the semiconductor substrate 101. Each of the contact structures 170 includes a barrier layer 173 and a conductive layer 175 disposed over and surrounded by the barrier layer 173. In some embodiments, the barrier layers 173 include titanium (Ti), titanium nitride (TiN), or a combination thereof, and the conductive layers 175 include tungsten (W). In some embodiments, the conductive layers 175 are separated from the dielectric layer 113, the source/drain structure 109 and the semiconductor substrate 101 by the barrier layers 173.

It should be noted that each of the barrier layers 173 has a first thickness T1 on the sidewalls 175S of the corresponding conductive layer 175, and each of the barrier layers 173 has a second thickness T2 under the bottom surface 175B of the corresponding conductive layer 175. In some embodiments, the barrier layers 173 are formed by an anisotropic deposition process so that the first thickness is less than the second thickness. In some embodiments, the anisotropic deposition process for forming the barrier layers 173 includes a physical vapor deposition (PVD) process. In some embodiments, the semiconductor device 100C is part of dynamic random access memory (DRAM).

Figure 4:
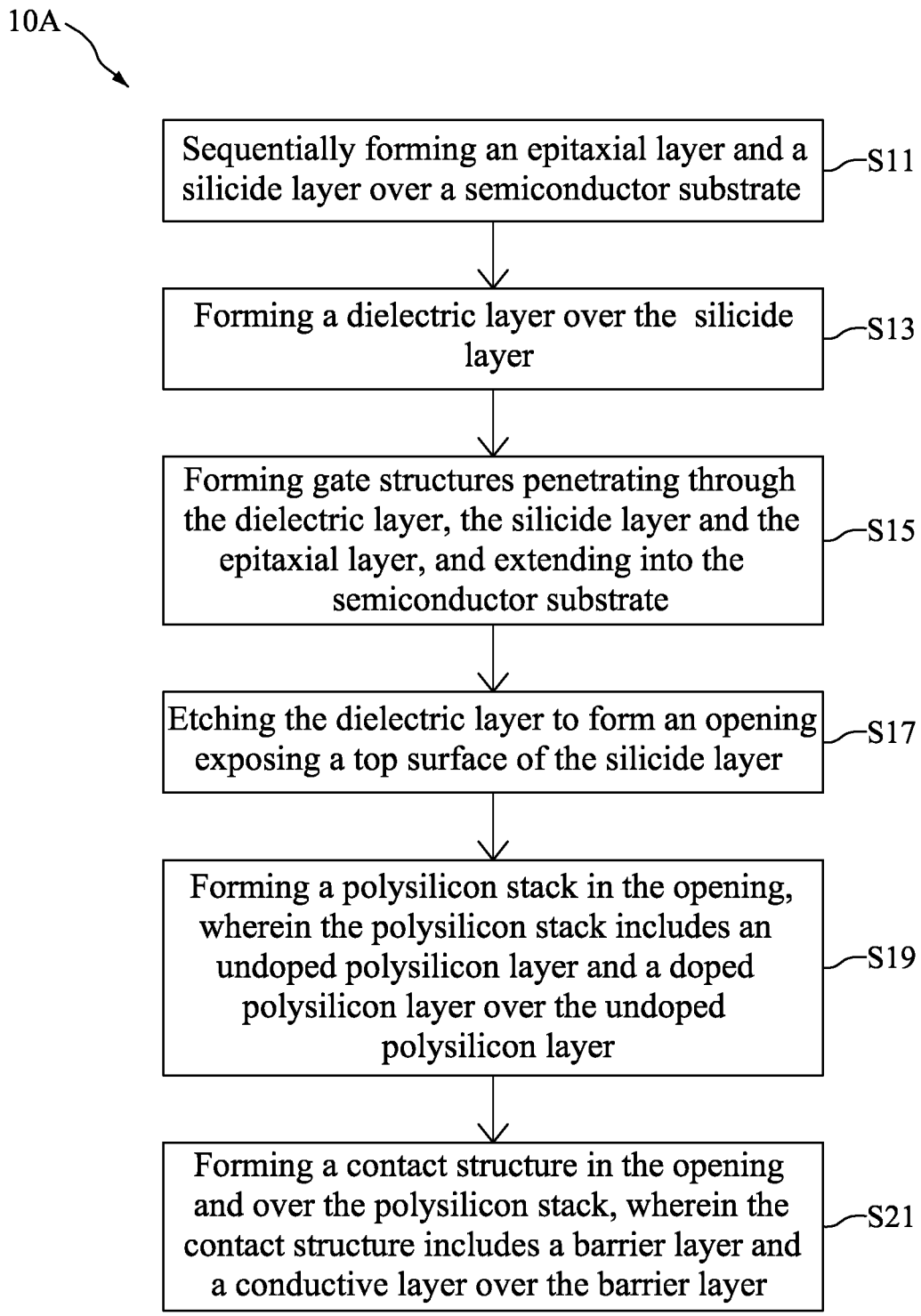
FIG. 4 is a flow diagram illustrating a method for preparing a semiconductor device, in accordance with some embodiments.
Figure 5:
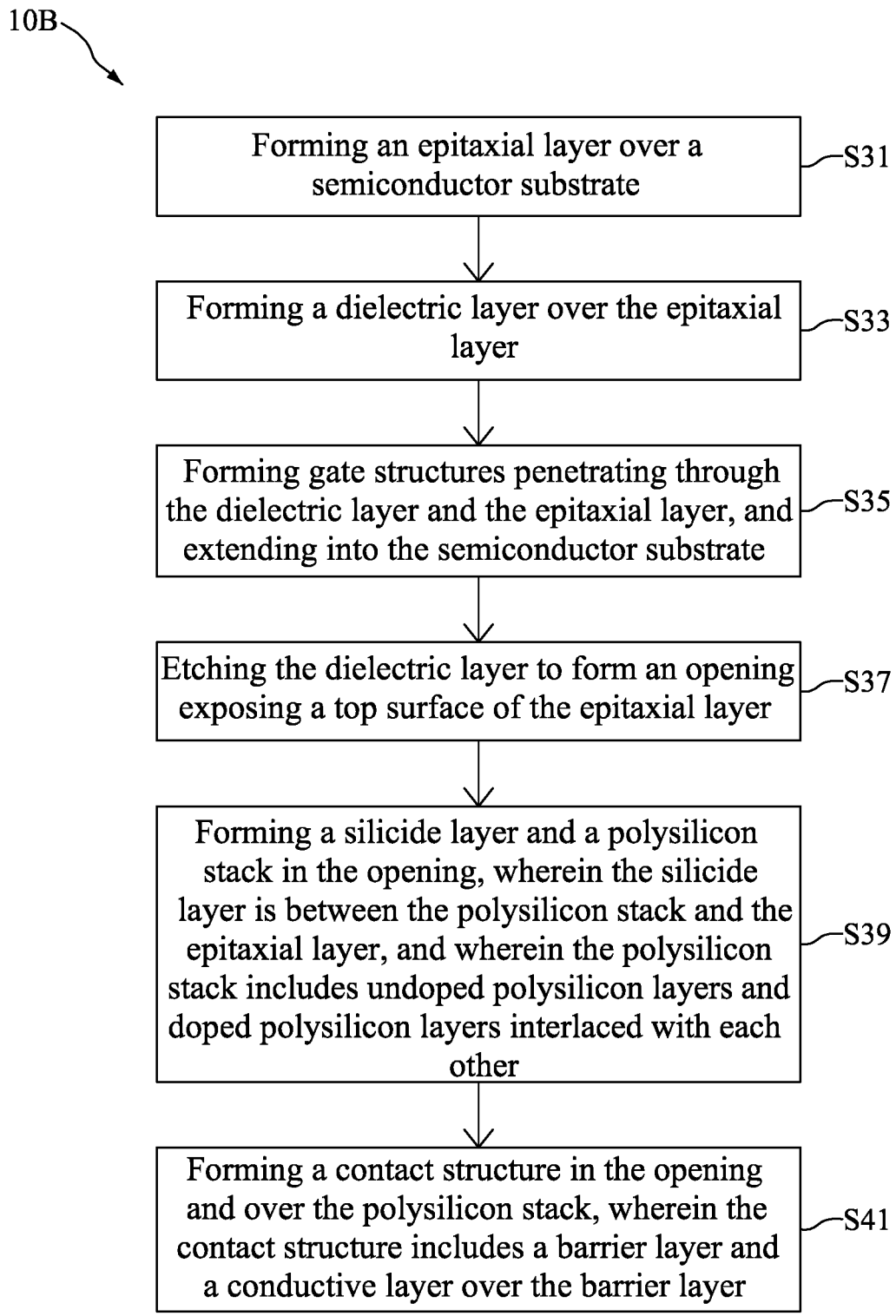
FIG. 5 is a flow diagram illustrating a method for preparing a semiconductor device, in accordance with some embodiments.
Figure 6:
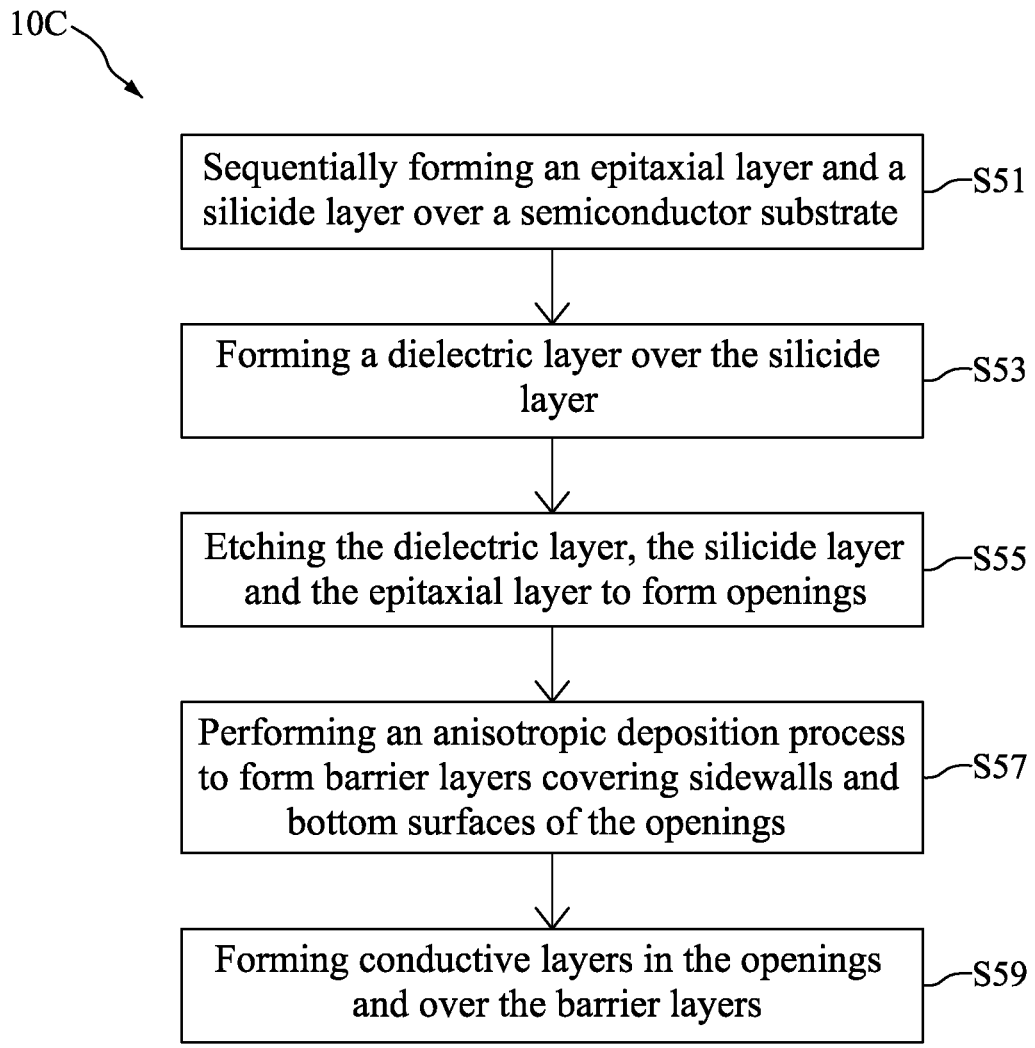
FIG. 6 is a flow diagram illustrating a method for preparing a semiconductor device, in accordance with some embodiments.

FIG. 4 is a flow diagram illustrating a method 10A for forming a semiconductor device (e.g., the semiconductor device 100A), and the method 10A includes steps S11, S13, S15, S17, S19, and S21, in accordance with some embodiments. FIG. 5 is a flow diagram illustrating a method 10B for forming a semiconductor device (e.g., the semiconductor device 100B), and the method 10B includes steps S31, S33, S35, S37, S39, and S41, in accordance with some embodiments. FIG. 6 is a flow diagram illustrating a method 10C for forming a semiconductor device (e.g., the semiconductor device 100C), and the method 10C includes steps S51, S53, S55, S57, and S59, in accordance with some embodiments.

The steps S11 to S21 of FIG. 4, the steps S31 to S41 of FIG. 5, and the steps S51 to S59 of FIG. 6 are elaborated in connection with the following figures.

Figure 7:
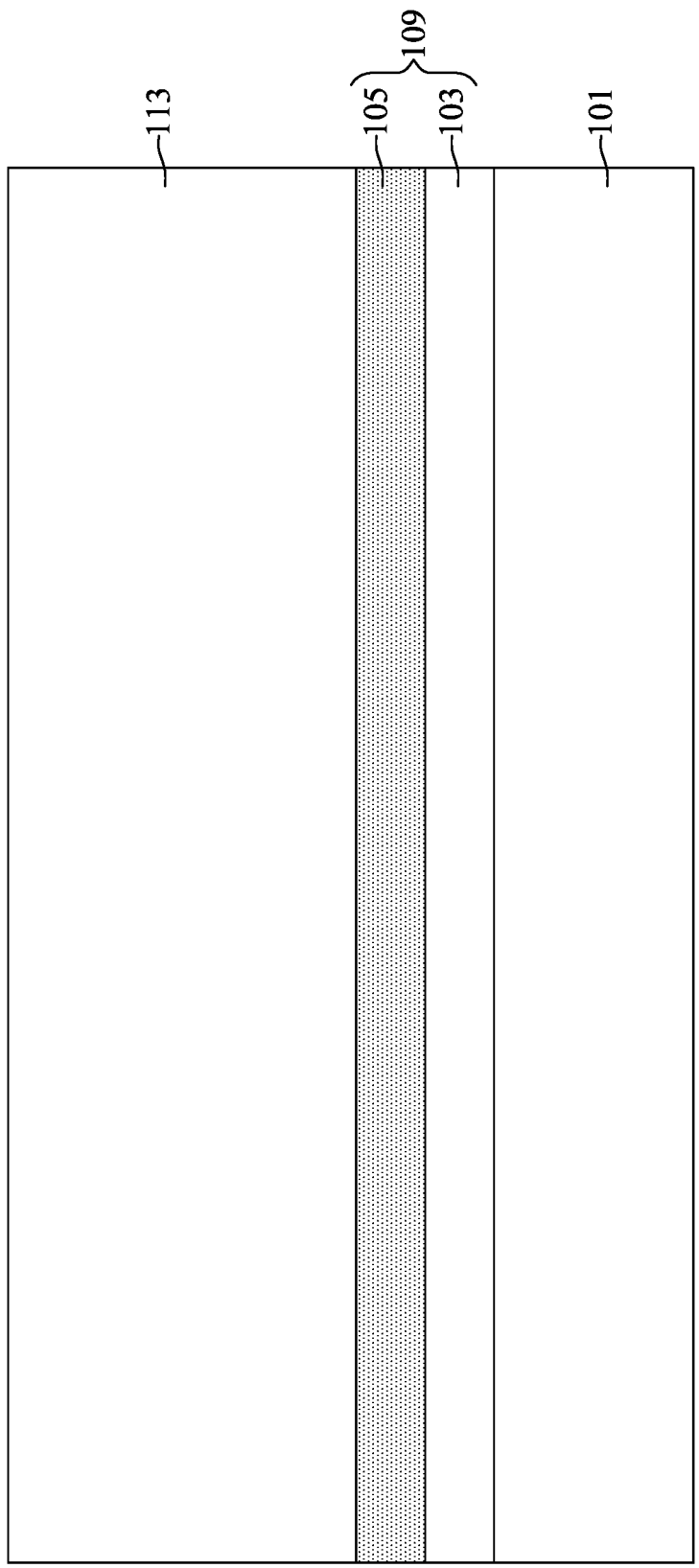
FIG. 7 is a cross-sectional view illustrating an intermediate stage of sequentially forming an epitaxial layer, a silicide layer, and a dielectric layer over a semiconductor substrate during the formation of the semiconductor device, in accordance with some embodiments.

FIGS. 7 to 15 illustrate intermediated stages of forming the semiconductor device 100A, in accordance with some embodiments. As shown in FIG. 7, a source/drain structure 109 including an epitaxial layer 103 and a silicide layer 105 is formed over a semiconductor substrate 101, in accordance with some embodiments. The respective step is illustrated as the step S11 in the method 10A shown in FIG. 4.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

The source/drain structure 109 may be a raised (or elevated) source/drain structure formed over the semiconductor substrate 101. In some embodiments, the epitaxial layer 103 of the source/drain structure 109 includes silicon (Si), and the silicide layer 105 of the source/drain structure 109 includes cobalt silicide ($CoSi_x$). In some embodiments, the epitaxial layer 103 is formed by an epitaxial growth method, which may include metal-organic chemical vapor deposition (MOCVD), vapor-phase epitaxy (VPE), molecular-beam epitaxy (MPE), liquid-phase epitaxy (LPE), or another suitable process. Moreover, in some embodiments, the silicide layer 105 is formed by a process that includes depositing a metal layer, such as cobalt (Co), and annealing the metal layer such that the metal layer can react with the epitaxial layer 103 to form the silicide layer 105.

After the source/drain structure 109 is formed, a dielectric layer 113 is formed over the silicide layer 105 of the source/drain structure 109, in accordance with some embodiments. The respective step is illustrated as the step S13 in the method 10A shown in FIG. 4. In some embodiments, the dielectric layer 113 includes silicon oxide, silicon nitride, silicon oxynitride, a dielectric material with low dielectric constant (low-k), or a combination thereof. The dielectric layer 113 may be formed by a deposition process, such as a chemical vapor deposition (CVD) process, a physical vapor deposition (PVD) process, an atomic layer deposition (ALD) process, or another suitable process.

Figure 8:
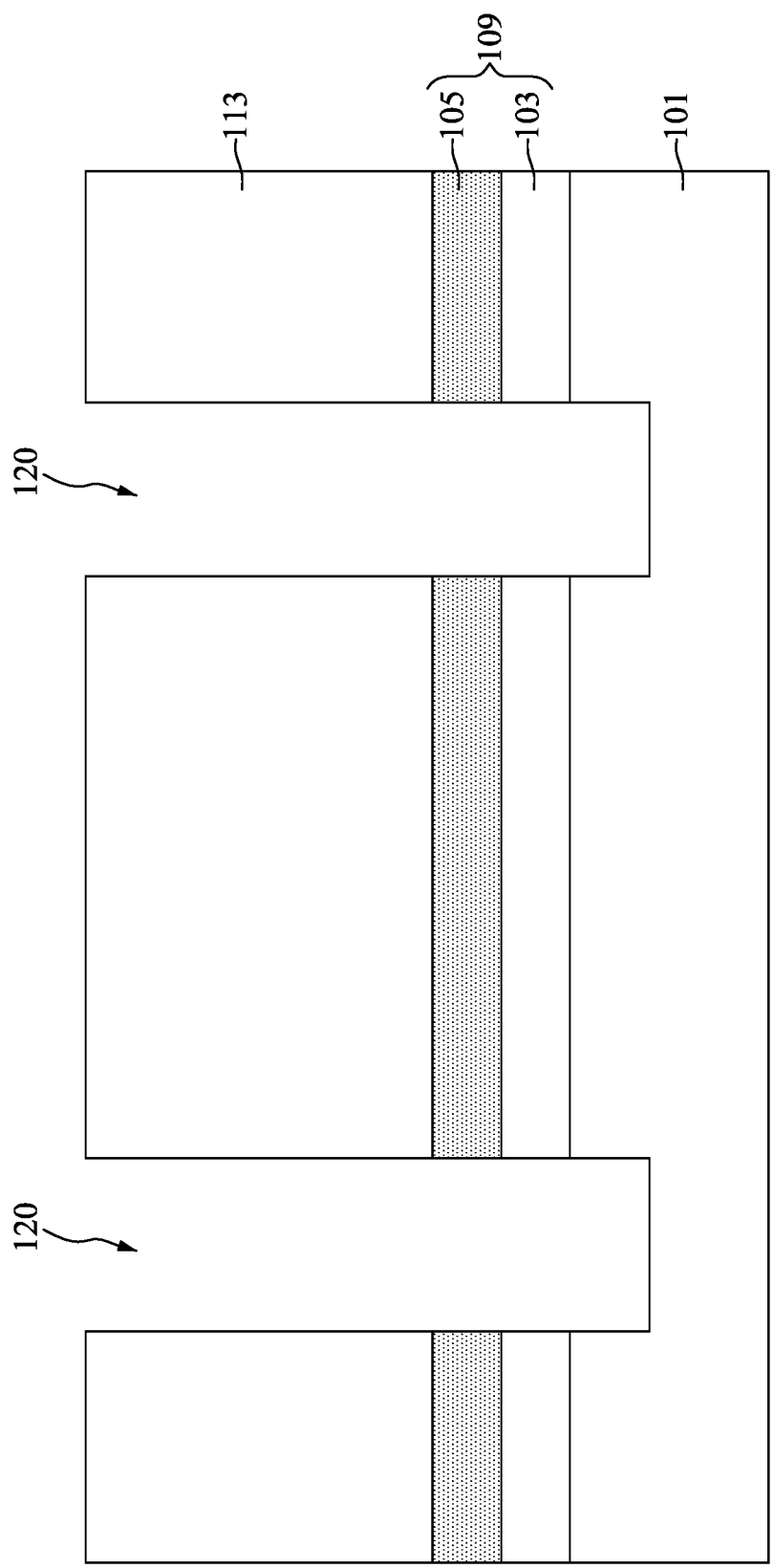
FIG. 8 is a cross-sectional view illustrating an intermediate stage of forming openings penetrating through the dielectric layer, the silicide layer, and the epitaxial layer during the formation of the semiconductor device, in accordance with some embodiments.

Next, openings 120 are formed penetrating through the dielectric layer 113 and the source/drain structure 109, as shown in FIG. 8 in accordance with some embodiments. In some embodiments, the openings 120 extend into the upper portion of the semiconductor substrate 101, such that the bottom surfaces of the openings 120 are located within the semiconductor substrate 101. The openings 120 may be formed by an etching process, and the locations of the openings 120 may be defined by a patterned mask (not shown) formed over the dielectric layer 113. The etching process may include a dry etching process, a wet etching process, or a combination thereof. After the etching process, the patterned mask may be removed.

Figure 9:
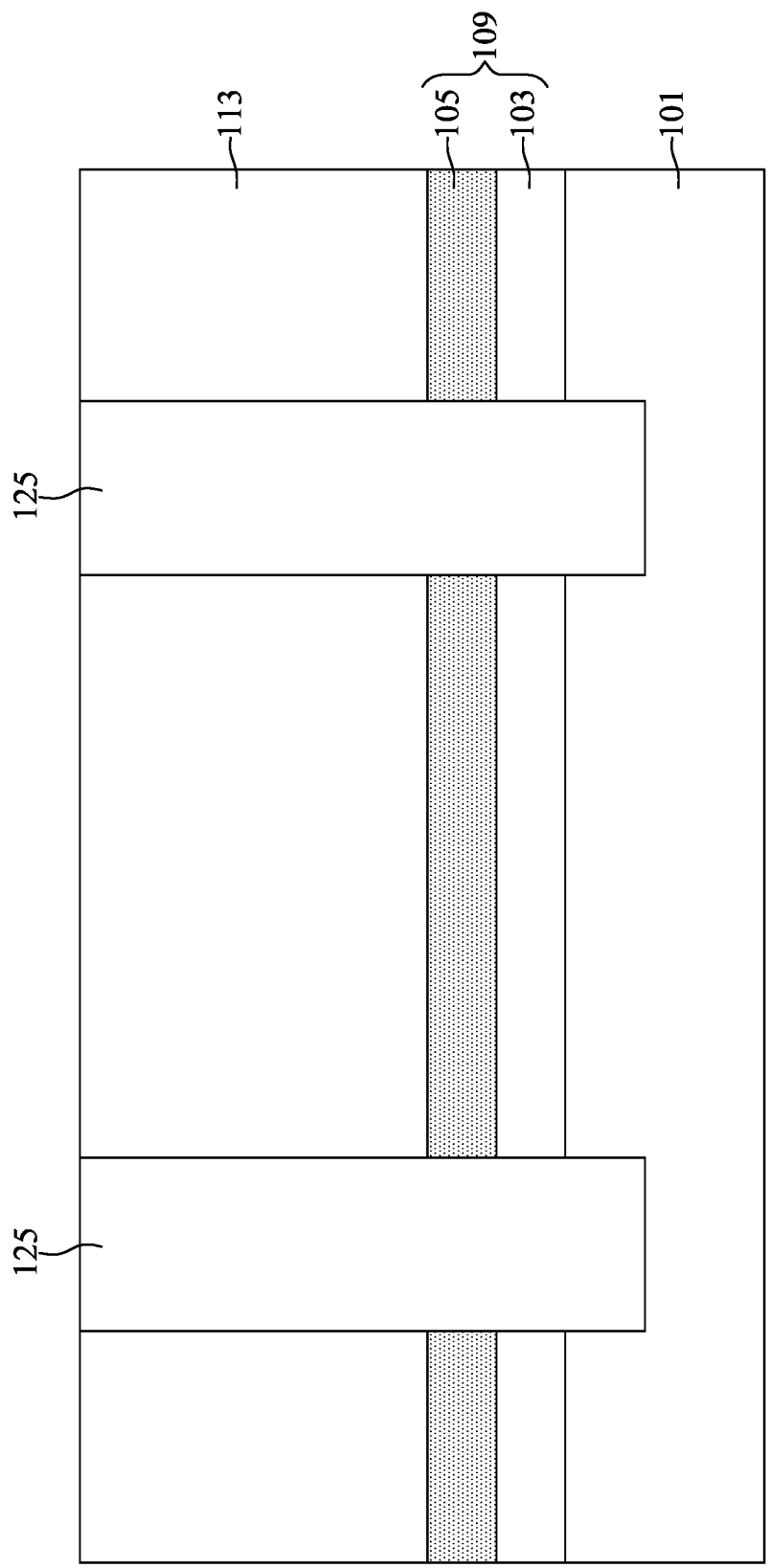
FIG. 9 is a cross-sectional view illustrating an intermediate stage of forming gate structures in the openings penetrating through the epitaxial layer, the silicide layer, and the dielectric layer during the formation of the semiconductor device, in accordance with some embodiments.

Subsequently, gate structures 125 are formed in the openings 120, as shown in FIG. 9 in accordance with some embodiments. The respective step is illustrated as the step S15 in the method 10A shown in FIG. 4. In some embodiments, the gate structures 125 are recessed gate structures of the DRAM. Each of the gate structures 125 includes a gate dielectric (not shown) and a gate electrode (not shown) disposed over and surrounded by the gate dielectric. Each of the gate dielectrics may include silicon oxide, silicon nitride, silicon oxynitride, a dielectric material with high dielectric constant (high-k), or a combination thereof, and each of the gate electrodes may include a conductive material such as aluminum (Al), copper (Cu), tungsten (W), titanium (Ti), tantalum (Ta), or may be a multi-layer structure including any combination of the above materials.

In addition, the formation of the gate structures 125 may include depositing a gate dielectric material (not shown) lining the openings 120 (see FIG. 8) and covering the top surface of the dielectric layer 113, depositing a gate electrode material (not shown) in the remaining portions of the openings 120 and over the top surface of the dielectric layer 113, and performing a planarization process on the gate dielectric material and the gate electrode material. The deposition processes may include CVD, PVD, ALD, or another suitable process. The planarization process may include a chemical mechanical polishing (CMP) process, a grinding process, an etching process, or another suitable process.

Figure 10:
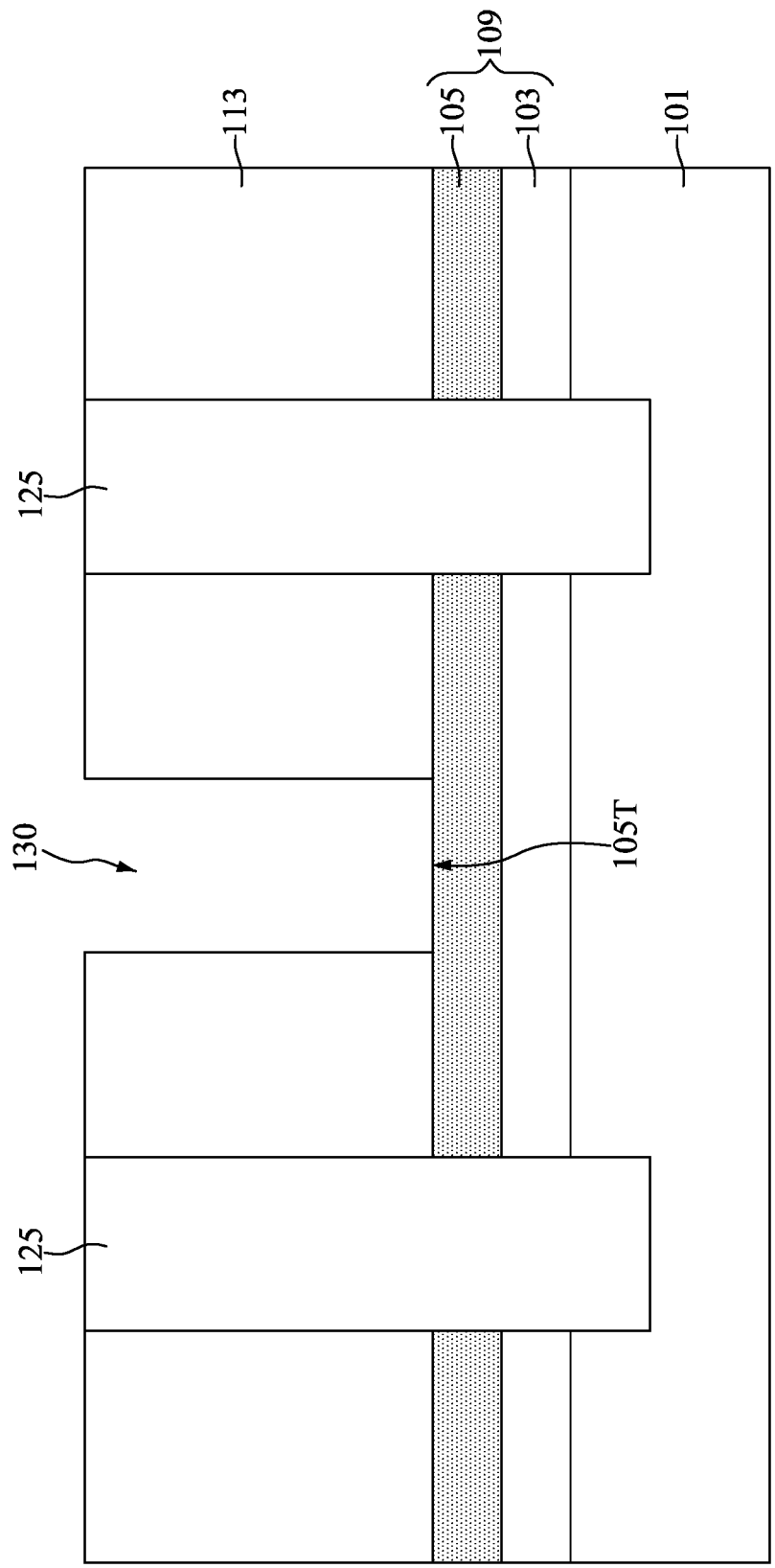
FIG. 10 is a cross-sectional view illustrating an intermediate stage of etching the dielectric layer to form an opening between the gate structures during the formation of the semiconductor device, in accordance with some embodiments.

After the gate structures 125 are formed, an opening 130 is formed penetrating through the dielectric layer 130, as shown in FIG. 10 in accordance with some embodiments. In some embodiments, the opening 130 is located between the gate structures 125, and a top surface 105T of the silicide layer 105 is exposed by the opening 130. The respective step is illustrated as the step S17 in the method 10A shown in FIG. 4. The opening 130 may be formed by an etching process, and the location of the opening 130 may be defined by a patterned mask (not shown) formed over the dielectric layer 113. The etching process may include a dry etching process, a wet etching process, or a combination thereof. After the etching process, the patterned mask may be removed.

Figure 11:
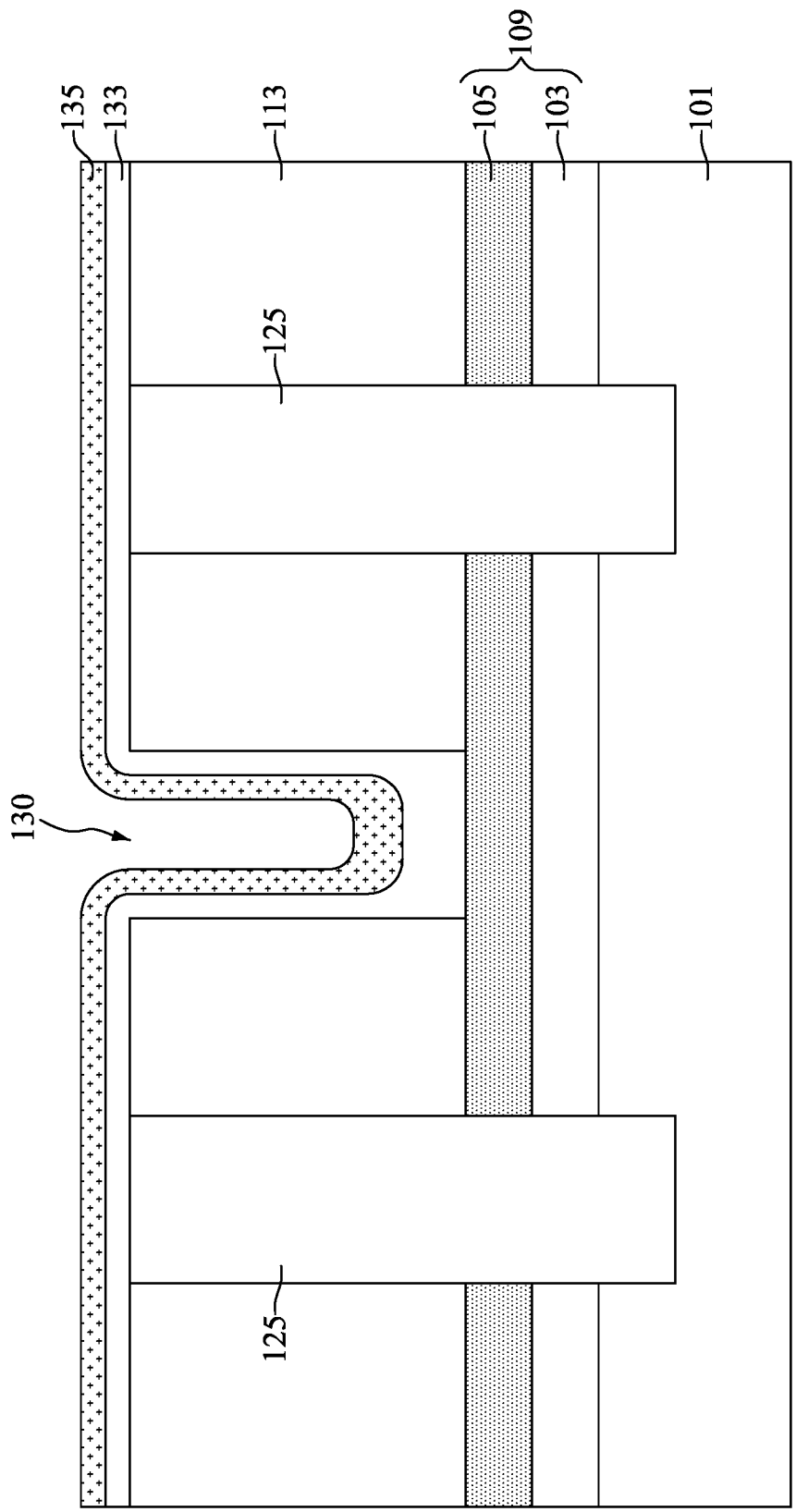
FIG. 11 is a cross-sectional view illustrating an intermediate stage of forming a first polysilicon layer and a second polysilicon layer in the opening and over the dielectric layer during the formation of the semiconductor device, in accordance with some embodiments.

Then, a first polysilicon layer 133 and a second polysilicon layer 135 are formed in the opening 130 and extending over the top surface of the dielectric layer 113, as shown in FIG. 11 in accordance with some embodiments. In some embodiments, the first polysilicon layer 133 and the second polysilicon layer 135 are formed by a deposition process, such as a CVD process, a PVD process, an ALD process, or a combination thereof.

In some embodiments, the first polysilicon layer 133 is undoped, and the second polysilicon layer 135 is doped with arsenic (As), boron (B), or phosphorous (P). In some embodiments, the second polysilicon layer 135 is in-situ doped during the deposition process. In some embodiments, the second polysilicon layer 135 is not in-situ doped, and instead an implantation process is performed to dope the second polysilicon layer 135.

Figure 12:
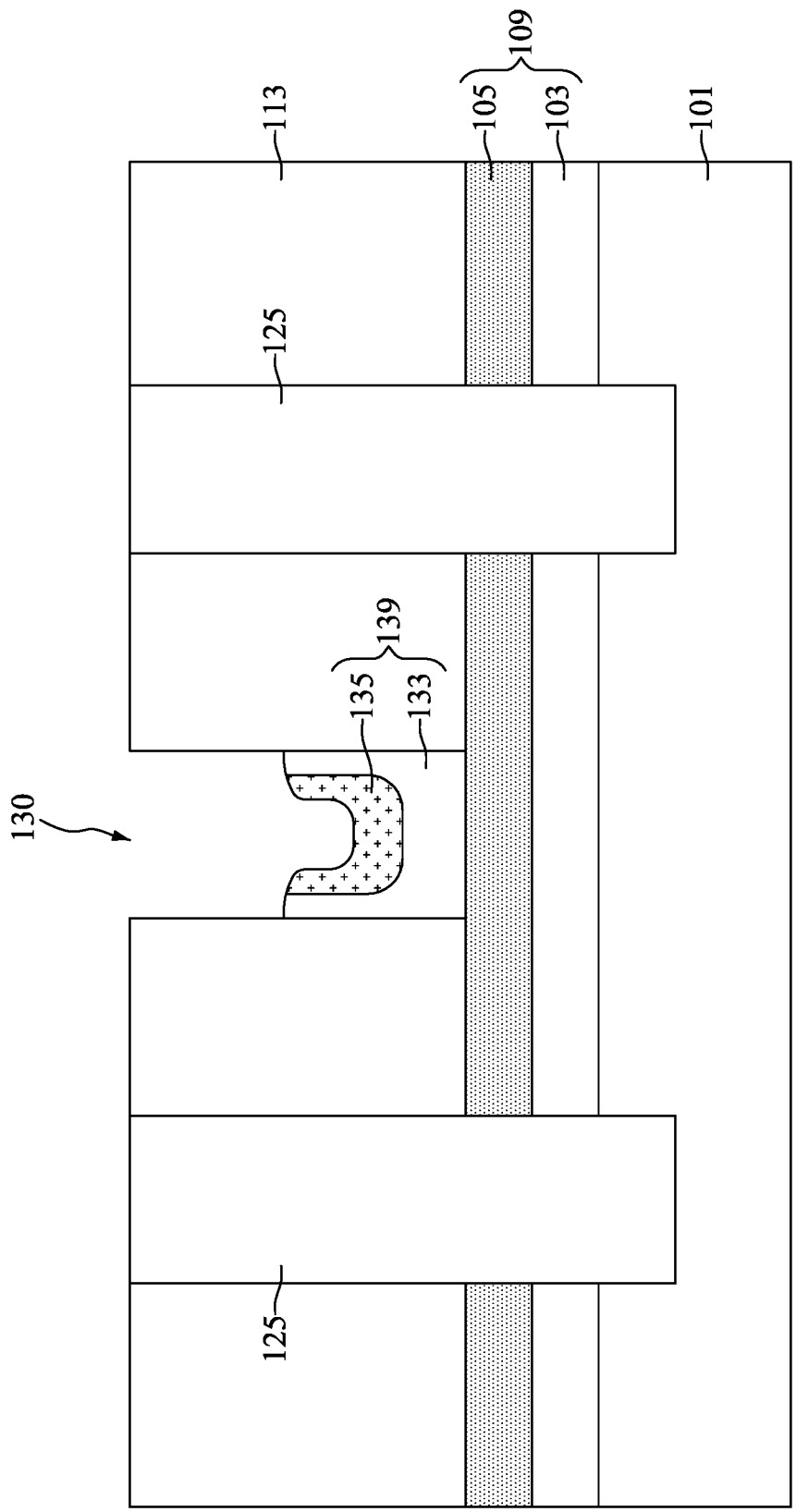
FIG. 12 is a cross-sectional view illustrating an intermediate stage of etching back the first polysilicon layer and the second polysilicon layer to form a polysilicon stack in the opening during the formation of the semiconductor device, in accordance with some embodiments.

Next, an etch back process is performed on the first polysilicon layer 133 and the second polysilicon layer 135 to remove the portions of the first polysilicon layer 133 and the second polysilicon layer 135 over the top surface of the dielectric layer 113, and to remove the portions of the first polysilicon layer 133 and the second polysilicon layer 135 occupying the upper portion of the opening 130, as shown in FIG. 12 in accordance with some embodiments. As illustrated, the remaining portions of the first polysilicon layer 133 and the second polysilicon layer 135 form a polysilicon stack 139. The etch back process may include a dry etching process, a wet etching process, or a combination thereof. The respective step is illustrated as the step S19 in the method 10A shown in FIG. 4. In addition, the first polysilicon layer 133 can be etched back before the deposition process for forming the second polysilicon layer 135 is performed.

It should be noted that although only two polysilicon layers (i.e., the first polysilicon layer 133 and the second polysilicon layer 135) are shown in the polysilicon stack 139, the polysilicon stack 139 may have more than two polysilicon layers. In some embodiments, the processes for forming the first polysilicon layer 133 and the second polysilicon layer 135 are repeated as a cycle to form more polysilicon layers over the second polysilicon layer 135. For example, a third polysilicon layer, which is undoped, is formed over the second polysilicon layer 135, and a fourth polysilicon layer, which is doped with arsenic (As), boron (B), or phosphorous (P), is formed over the third polysilicon layer. In these cases, the dopant concentration of the second polysilicon layer 135 is greater than the dopant concentration of the fourth polysilicon layer.

Figure 13:
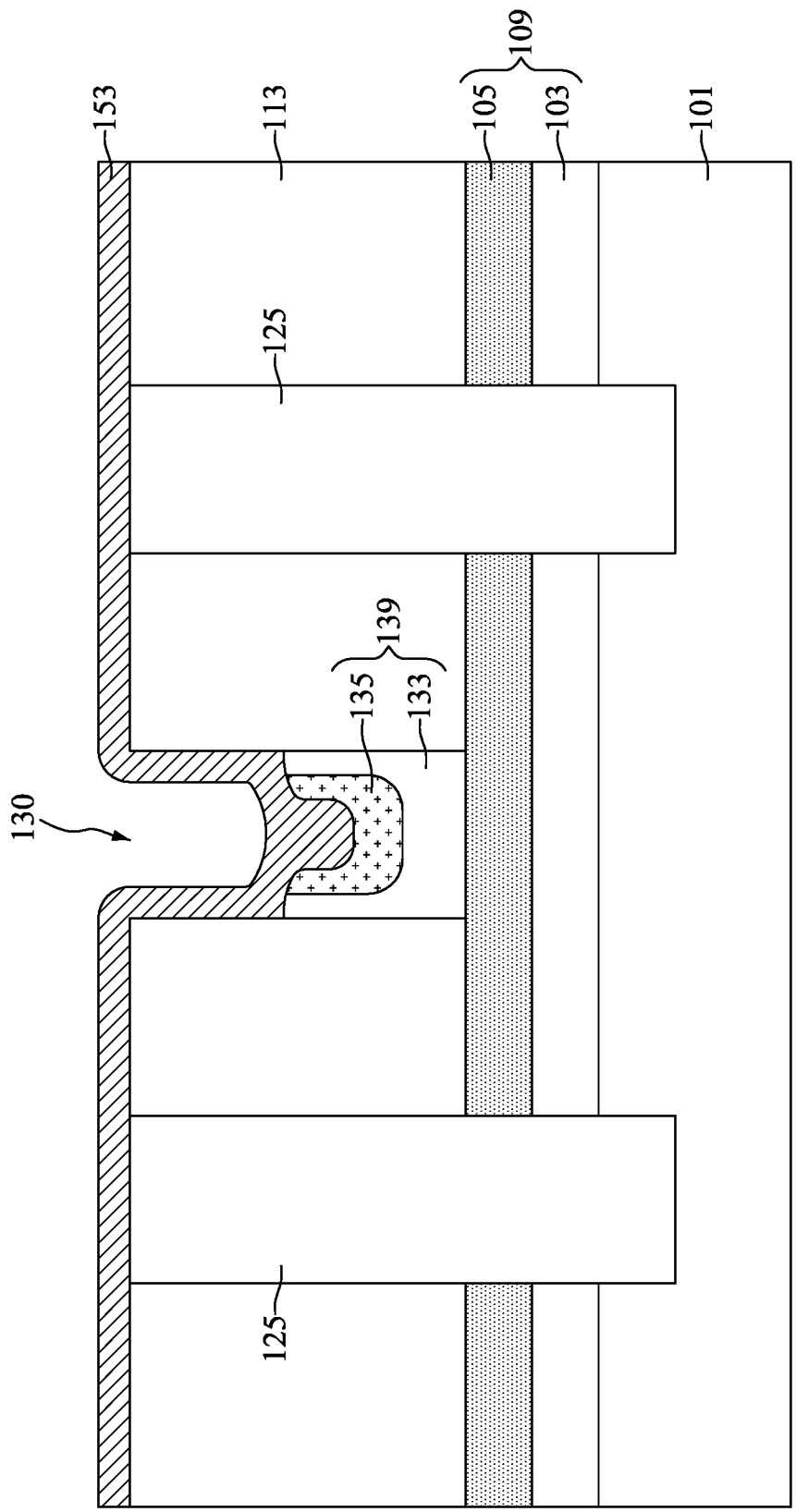
FIG. 13 is a cross-sectional view illustrating an intermediate stage of forming a barrier layer in the opening and over the dielectric layer during the formation of the semiconductor device, in accordance with some embodiments.

Subsequently, a barrier layer 153 is formed in the opening 130 and over the polysilicon stack 139, and the barrier layer 153 extends over the top surface of the dielectric layer 113, as shown in FIG. 13 in accordance with some embodiments. In some embodiments, the barrier layer 153 includes titanium (Ti), titanium nitride (TiN), or a combination thereof. Moreover, the barrier layer 153 may be formed by a deposition process, such as a CVD process, a PVD process, an ALD process, or a combination thereof.

Figure 14:
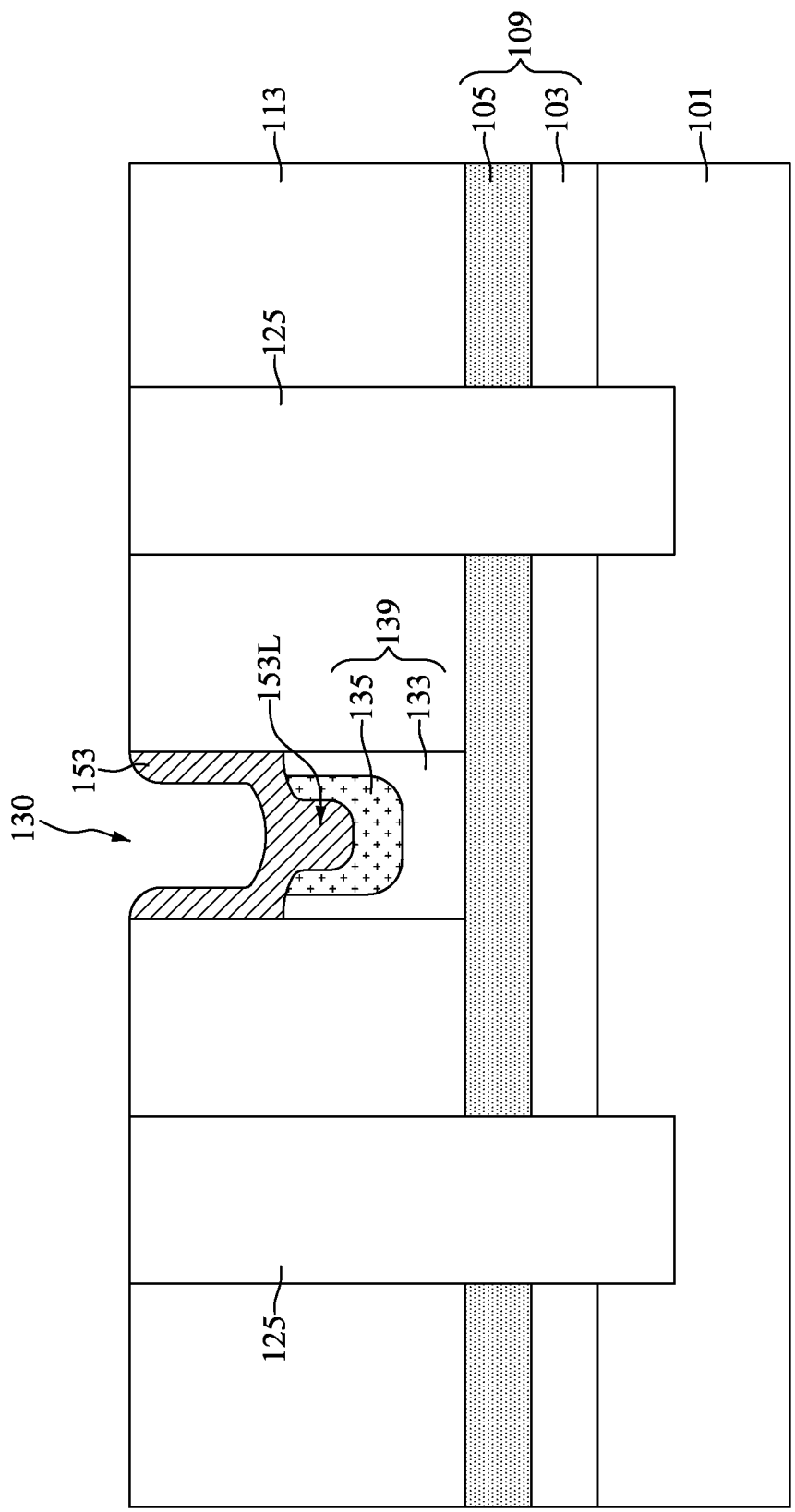
FIG. 14 is a cross-sectional view illustrating an intermediate stage of etching back the barrier layer during the formation of the semiconductor device, in accordance with some embodiments.

Then, an etching process is performed on the barrier layer 153 to remove the excess portion of the barrier layer 153 over the top surface of the dielectric layer 113, as shown in FIG. 14 in accordance with some embodiments. The excess portion of the barrier layer 153 may be removed by an etch back process, or a planarization process (e.g., CMP, grinding, or the like). In some embodiments, the lower portion 153L of the barrier layer 153 is surrounded by the second polysilicon layer 135. In some embodiments, the barrier layer 153 is in direct contact with the first polysilicon layer 133 and the second polysilicon layer 135.

Figure 15:
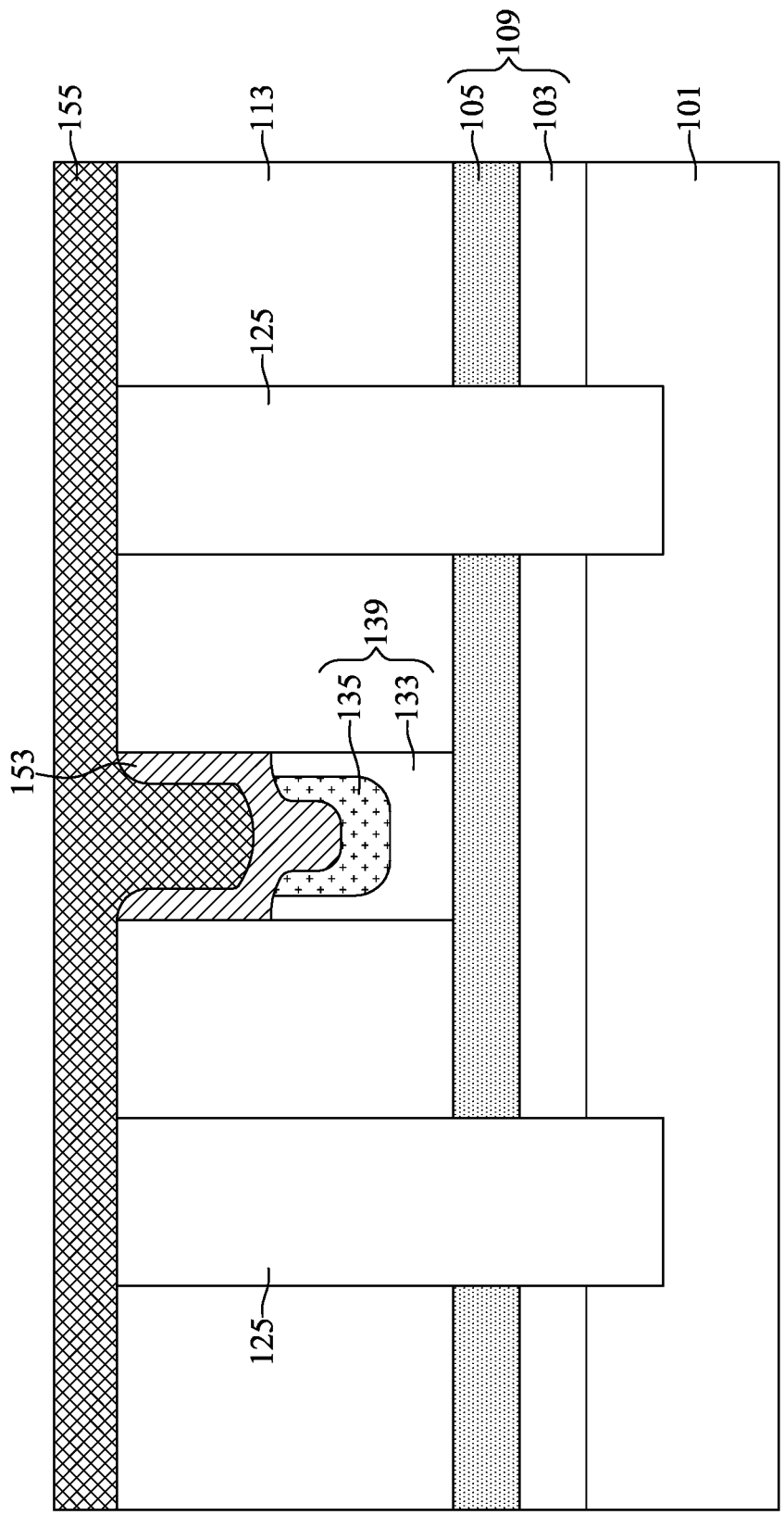
FIG. 15 is a cross-sectional view illustrating an intermediate stage of forming a conductive layer in the opening and over the dielectric layer during the formation of the semiconductor device, in accordance with some embodiments.

Next, the remaining portion of the opening 130 is filled by a conductive layer 155, and the conductive layer 155 extends over the top surface of the dielectric layer 113, as shown in FIG. 15 in accordance with some embodiments. In some embodiments, the conductive layer 135 includes tungsten (W). Moreover, the conductive layer 155 may be formed by a deposition process, such as a CVD process, a PVD process, an ALD process, or a combination thereof.

Subsequently, a planarization process may be performed on the conductive layer 155 to remove the excess portion of the conductive layer 155 over the top surface of the dielectric layer 113, as shown in FIG. 1 in accordance with some embodiments. After the planarization process, a conductive structure 159 including the barrier layer 153 and the conductive layer 155 is formed over the polysilicon stack 139 and surrounded by the dielectric layer 113. The respective step is illustrated as the step S21 in the method 10A shown in FIG. 4.

The planarization process may include a CMP process. After the conductive structure 159 is formed, the semiconductor device 100A is obtained. Since the polysilicon stack 139 with an undoped polysilicon layer (i.e., the first polysilicon layer 133) and a doped polysilicon layer (i.e., the second polysilicon layer 135) over the undoped polysilicon layer is formed between the source/drain structure 109 and the contact structure 159, the contact resistance may be reduced. As a result, the device performance of the semiconductor device 100A may be enhanced.

Figure 16:
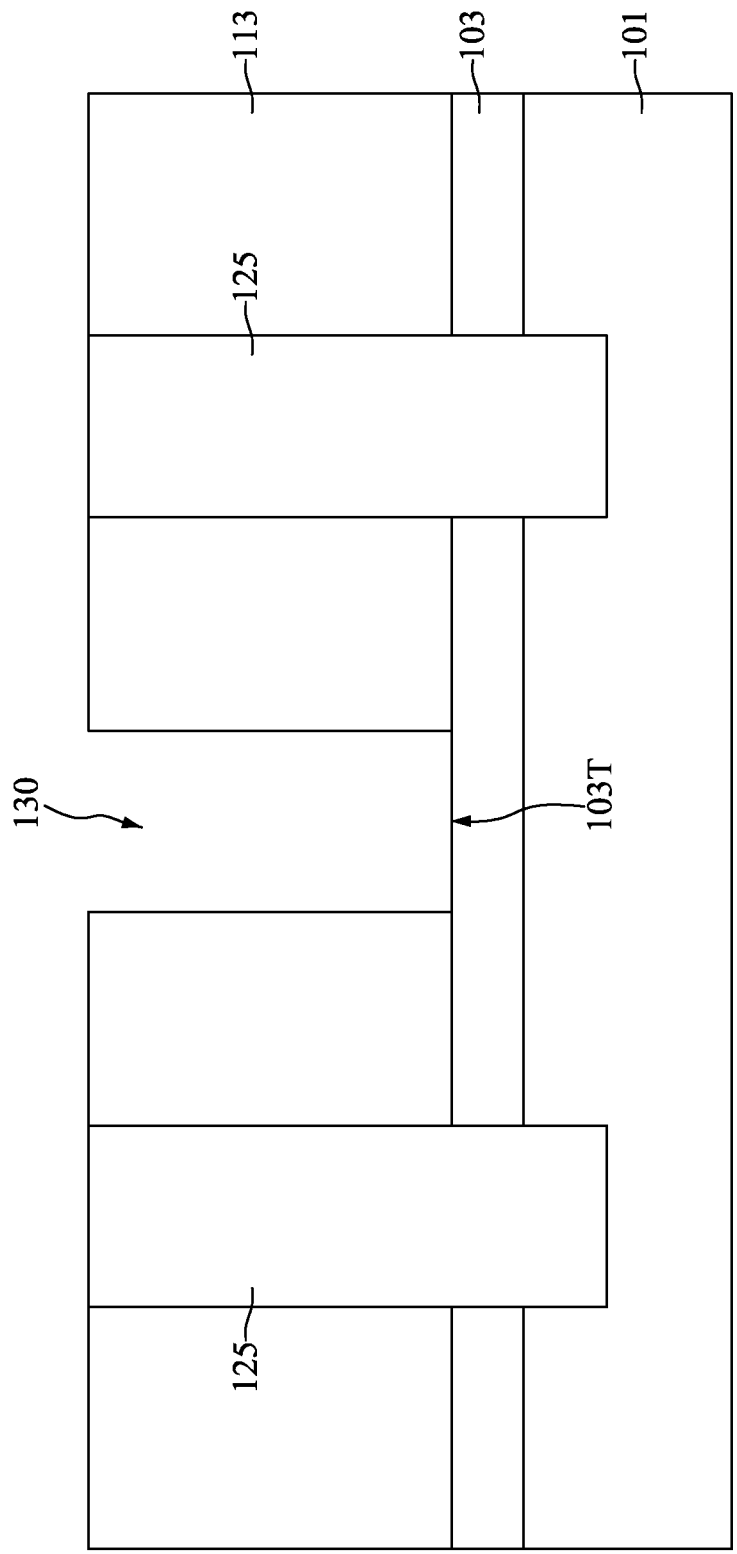
FIG. 16 is a cross-sectional view illustrating an intermediate stage of sequentially forming an opening between the gate structures during the formation of the semiconductor device, in accordance with some embodiments.

FIGS. 16 to 22 illustrate intermediated stages of forming the semiconductor device 100B continued from the step similar to the step shown in FIG. 9, in accordance with some embodiments. As illustrated, one of the differences between the semiconductor devices 100A and 100B is the location of the silicide layer. As shown in FIG. 16, the epitaxial layer 103 is formed sandwiched between the dielectric layer 113 and the semiconductor substrate 101, and the gate structures 125 are formed penetrating through the dielectric layer 113 and the epitaxial layer 103, and extending into the upper portion of the semiconductor substrate 101, in accordance with some embodiments. The respective steps are illustrated as the steps S31 to S35 in the method 10B shown in FIG. 5. Some materials and processes used to form the epitaxial layer 103, the dielectric layer 113 and the gate structure 125 in the semiconductor device 100B are similar to, or the same as those used to form the epitaxial layer 103, the dielectric layer 113 and the gate structure 125 in the semiconductor device 100A and details thereof are not repeated herein.

After the gate structures 125 are formed, an opening 130 is formed penetrating through the dielectric layer 113 and exposing the top surface 103T of the epitaxial layer 103, as shown in FIG. 16 in accordance with some embodiments. The respective step is illustrated as the step S37 in the method 10B shown in FIG. 5. Some processes used to form the opening 130 in the semiconductor device 100B are similar to, or the same as those used to form the opening 130 in the semiconductor device 100A and details thereof are not repeated herein.

Figure 17:
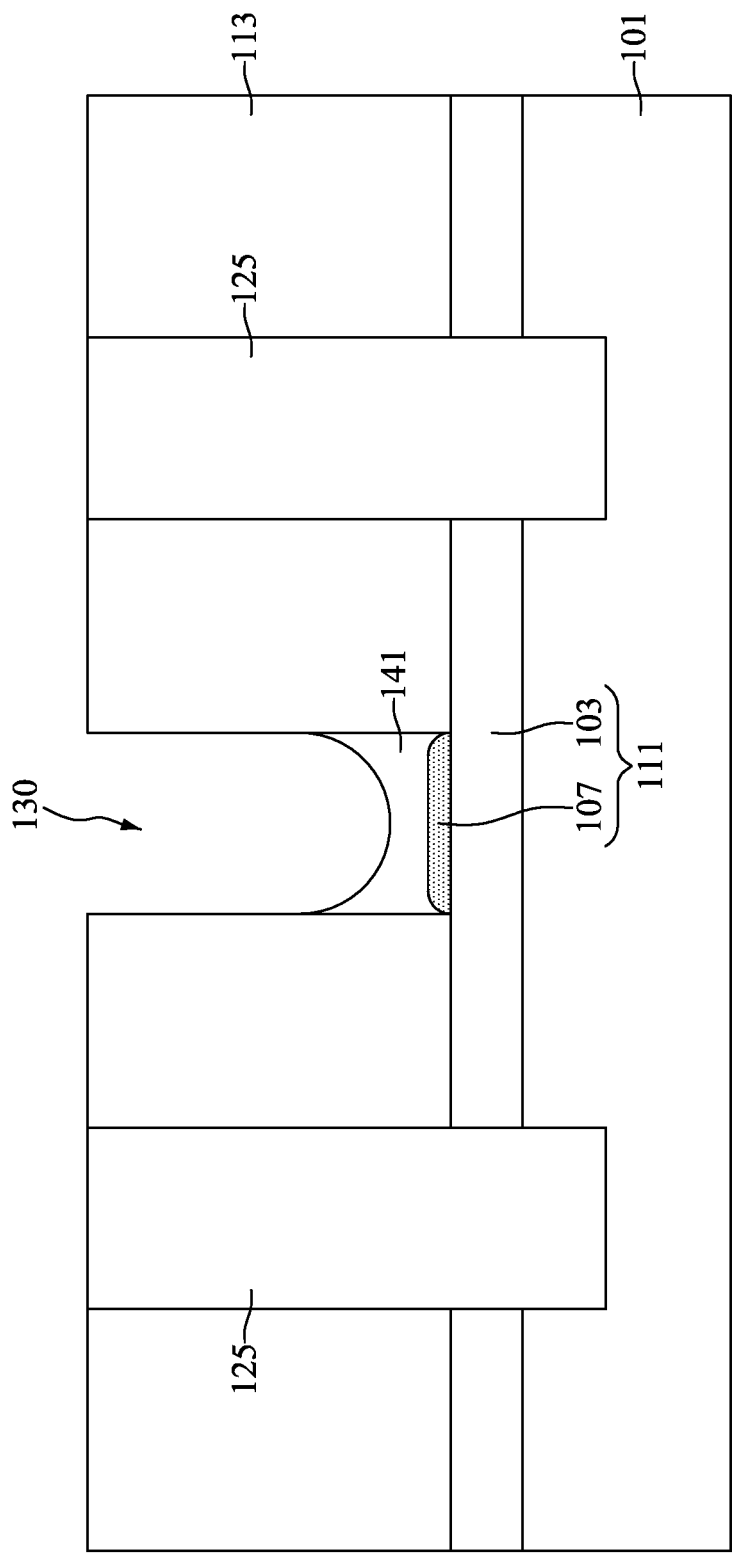
FIG. 17 is a cross-sectional view illustrating an intermediate stage of forming a silicide layer and a first polysilicon layer in the opening during the formation of the semiconductor device, in accordance with some embodiments.

Next, a silicide layer 107 and a first polysilicon layer 141 is formed in the opening 130, as shown in FIG. 17 in accordance with some embodiments. In some embodiments, the silicide layer 107 includes cobalt silicide ($CoSi_x$). The silicide layer 107 and the underlying epitaxial layer 103 collectively form the source/drain structure 111 of the semiconductor device 100B.

In some embodiments, the silicide layer 107 is formed between the epitaxial layer 103 and the first polysilicon layer 141 during the forming of the first polysilicon layer 141, and the silicide layer 107 is surrounded by the dielectric layer 113. In some embodiments, the first polysilicon layer 141 is undoped, and is formed by a deposition process, such as a CVD process, a PVD process, an ALD process, or a combination thereof. After the deposition process, an etch back process may be performed to remove excess portion(s) of the first polysilicon layer 141 in the upper portion of the opening 130 and/or over the top surface of the dielectric layer 113.

Figure 18:
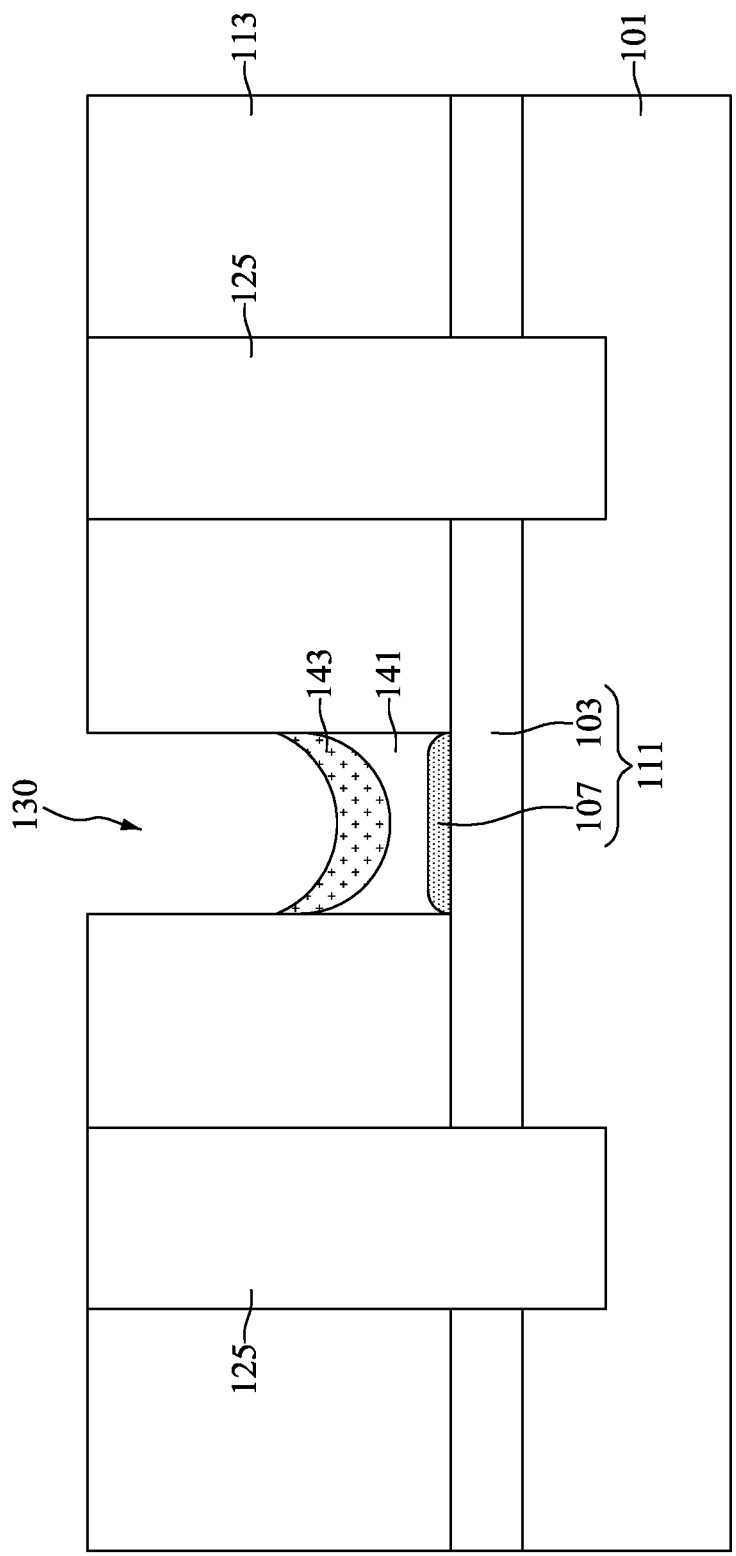
FIG. 18 is a cross-sectional view illustrating an intermediate stage of forming a second polysilicon layer in the opening during the formation of the semiconductor device, in accordance with some embodiments.

Subsequently, a second polysilicon layer 143 is formed in the opening 130 and over the first polysilicon layer 141, as shown in FIG. 18 in accordance with some embodiments. In some embodiments, the second polysilicon layer 143 is formed by a deposition process, such as a CVD process, a PVD process, an ALD process, or a combination thereof. In some embodiments, the second polysilicon layer 143 is doped with arsenic (As), boron (B), or phosphorous (P), and the second polysilicon layer 143 is in-situ doped during the deposition process. In some embodiments, the second polysilicon layer 143 is not in-situ doped, and instead an implantation process is performed to dope the second polysilicon layer 143. After the deposition process, an etch back process may be performed to remove excess portion(s) of the second polysilicon layer 143 in the upper portion of the opening 130 and/or over the top surface of the dielectric layer 113.

Figure 19:
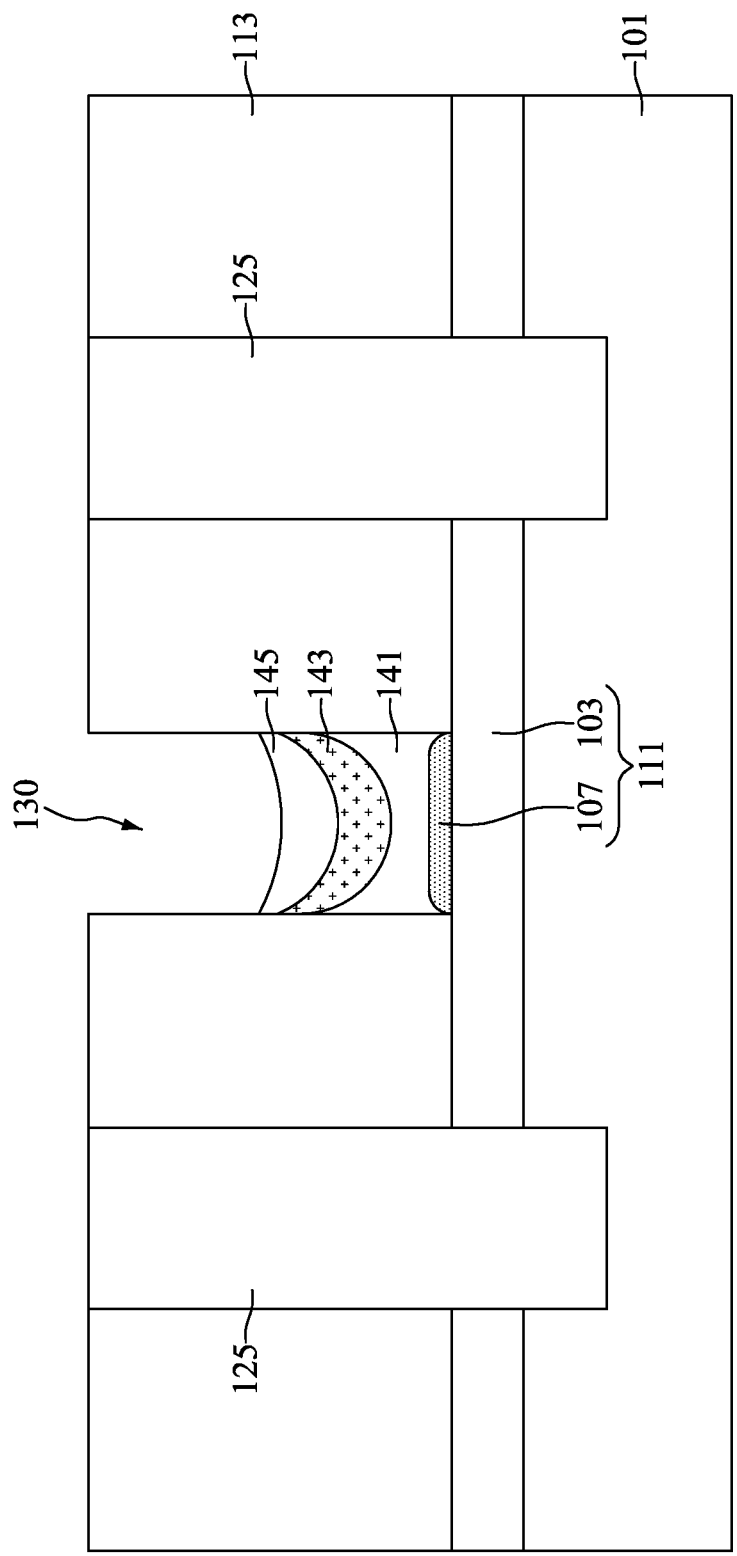
FIG. 19 is a cross-sectional view illustrating an intermediate stage of forming a third polysilicon layer in the opening during the formation of the semiconductor device, in accordance with some embodiments.

Then, a third polysilicon layer 145 is formed in the opening 130 and over the second polysilicon layer 143, as shown in FIG. 19 in accordance with some embodiments. In some embodiments, the third polysilicon layer 145 is undoped, and is formed by a deposition process, such as a CVD process, a PVD process, an ALD process, or a combination thereof. After the deposition process, an etch back process may be performed to remove excess portion(s) of the third polysilicon layer 145 in the upper portion of the opening 130 and/or over the top surface of the dielectric layer 113.

Figure 20:
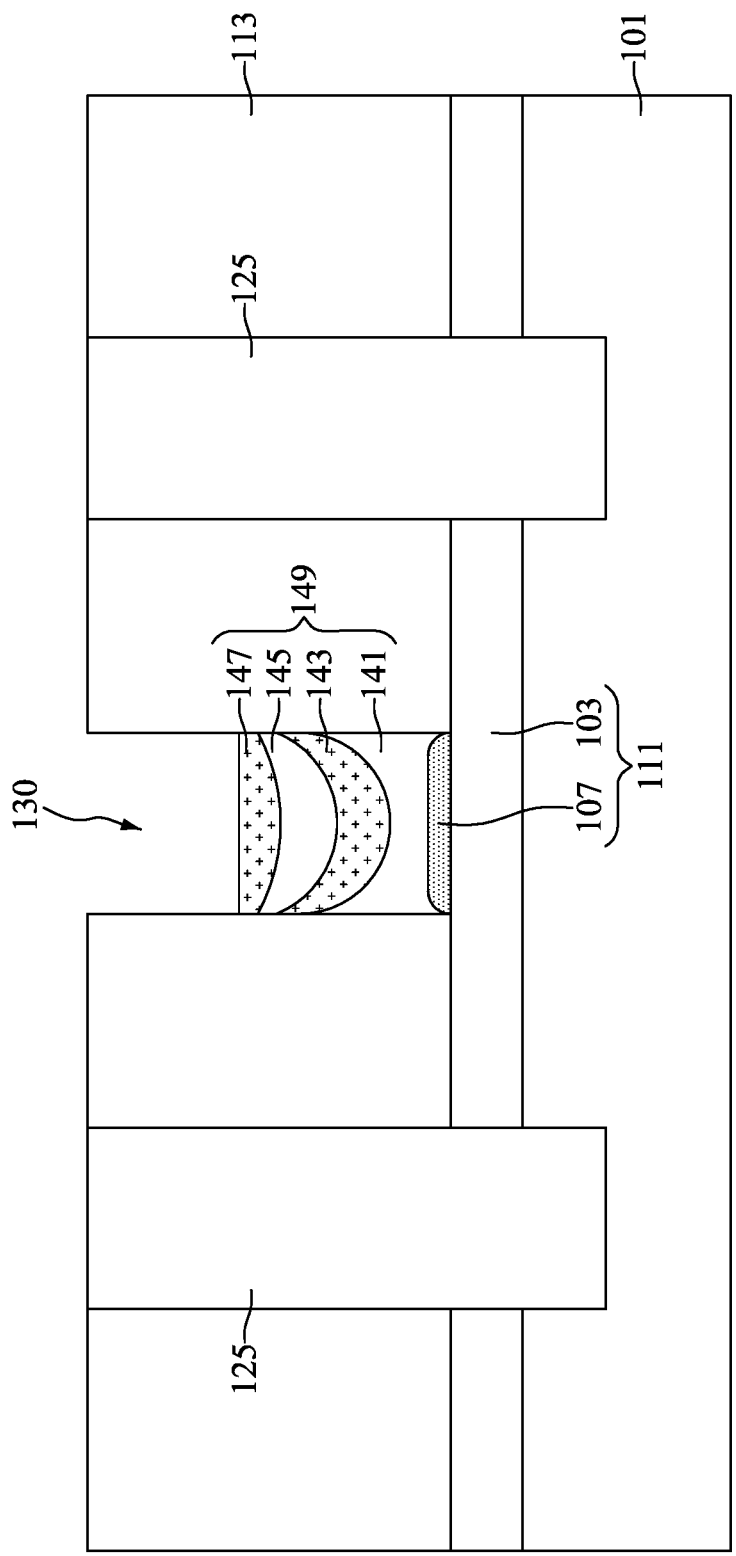
FIG. 20 is a cross-sectional view illustrating an intermediate stage of forming a fourth polysilicon layer in the opening during the formation of the semiconductor device, in accordance with some embodiments.

Next, a fourth polysilicon layer 147 is formed in the opening 130 and over the third polysilicon layer 145, as shown in FIG. 20 in accordance with some embodiments. In some embodiments, the fourth polysilicon layer 147 is formed by a deposition process, such as a CVD process, a PVD process, an ALD process, or a combination thereof. In some embodiments, the fourth polysilicon layer 147 is doped with arsenic (As), boron (B), or phosphorous (P), and the dopant concentration of the second polysilicon layer 143 is greater than the dopant concentration of the fourth polysilicon layer 147.

In some embodiments, the fourth polysilicon layer 147 is in-situ doped during the deposition process. In some embodiments, the fourth polysilicon layer 147 is not in-situ doped, and instead an implantation process is performed to dope the fourth polysilicon layer 147. After the deposition process, an etch back process may be performed to remove excess portion(s) of fourth polysilicon layer 147 in the upper portion of the opening 130 and/or over the top surface of the dielectric layer 113. After the etch back process is performed, as illustrated, the remaining portions of the fourth polysilicon layer 147, the third polysilicon layer 145, the second polysilicon layer 143 and the first polysilicon layer 141 form a polysilicon stack 149 occupying the lower portion of the opening 130, in accordance with some embodiments. The respective step is illustrated as the step S39 in the method 10B shown in FIG. 5. In some embodiments, the polysilicon stack 149 has a substantially flat top surface.

It should be noted that the polysilicon stack 149 may have more than four polysilicon layers. In some embodiments, the processes for forming the third polysilicon layer 145 and the fourth polysilicon layer 147 are repeated as a cycle to form more polysilicon layers over the fourth polysilicon layer 147. For example, a fifth polysilicon layer, which is undoped, is formed over the fourth polysilicon layer 147, and a sixth polysilicon layer, which is doped with arsenic (As), boron (B), or phosphorous (P), is formed over the fifth polysilicon layer. In these cases, the dopant concentration of the fourth polysilicon layer 147 is greater than the dopant concentration of the sixth polysilicon layer, and the topmost polysilicon layer has a substantially flat top surface.

Figure 21:
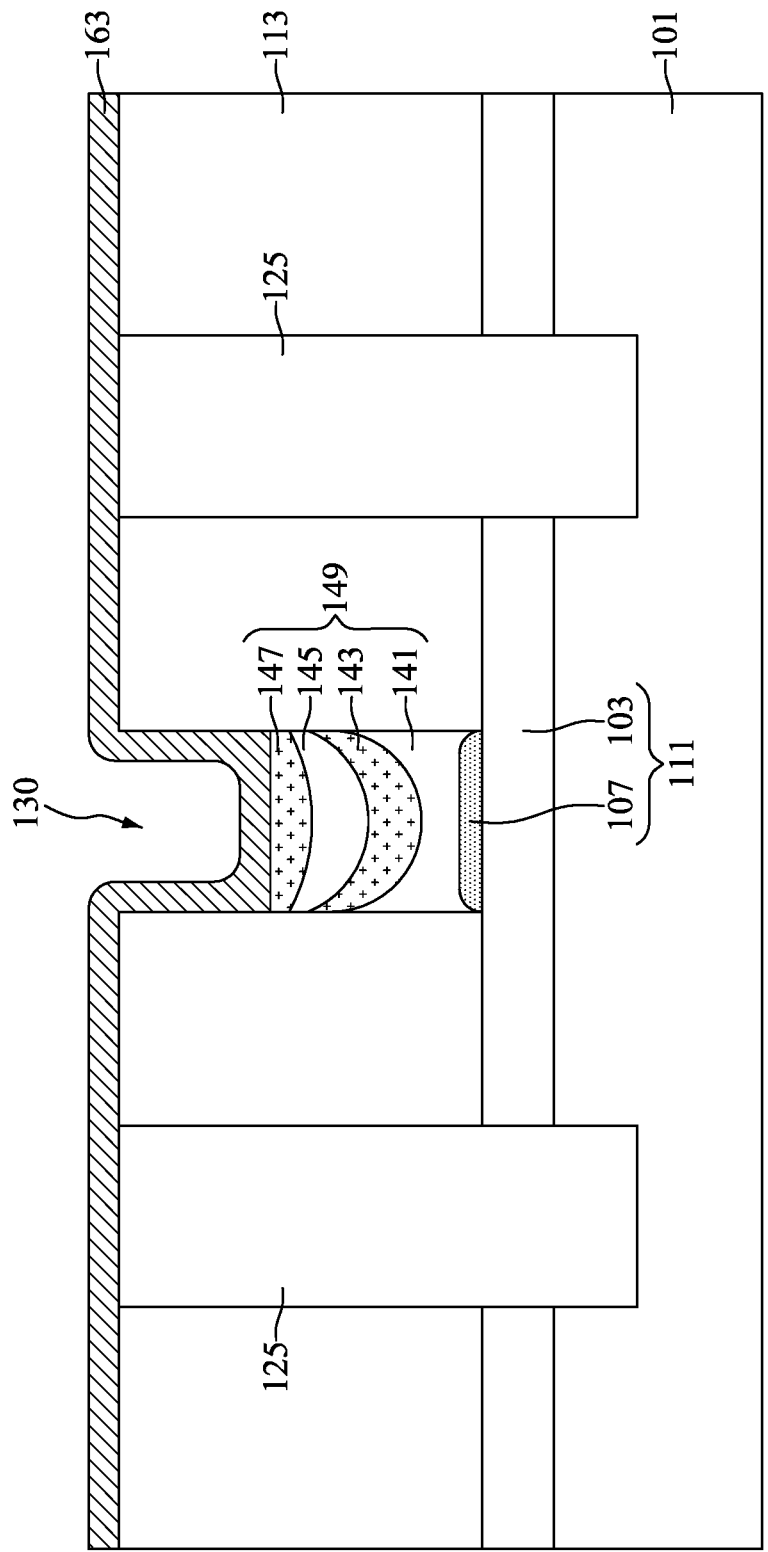
FIG. 21 is a cross-sectional view illustrating an intermediate stage of forming a barrier layer in the opening and over the dielectric layer during the formation of the semiconductor device, in accordance with some embodiments.

Subsequently, a barrier layer 163 is formed in the opening 130 and over the polysilicon stack 149, and the barrier layer 163 extends over the top surface of the dielectric layer 113, as shown in FIG. 21 in accordance with some embodiments. In some embodiments, the barrier layer 163 includes titanium (Ti), titanium nitride (TiN), or a combination thereof. Moreover, the barrier layer 163 may be formed by a deposition process, such as a CVD process, a PVD process, an ALD process, or a combination thereof.

Figure 22:
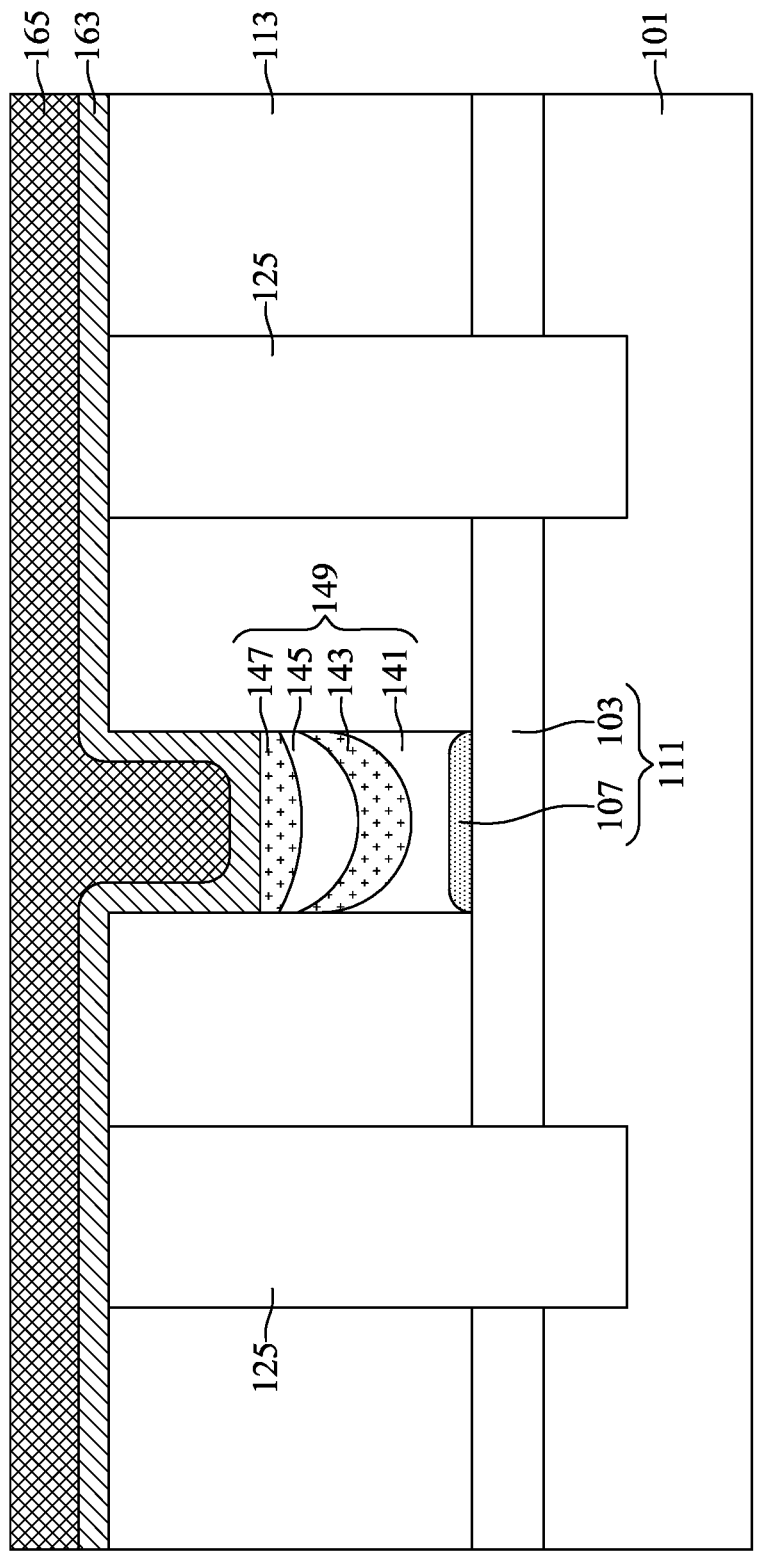
FIG. 22 is a cross-sectional view illustrating an intermediate stage of forming a conductive layer in the opening and over the dielectric layer during the formation of the semiconductor device, in accordance with some embodiments.

Then, a conductive layer 165 is formed over the barrier layer 163, and the remaining portion of the opening 130 over the barrier layer 163 is filled by the conductive layer 165, as shown in FIG. 22 in accordance with some embodiments. In some embodiments, the conductive layer 135 includes tungsten (W). Moreover, the conductive layer 155 may be formed by a deposition process, such as a CVD process, a PVD process, an ALD process, or a combination thereof.

Next, a planarization process may be performed to remove the excess portions of the barrier layer 163 and the conductive layer 165 over the top surface of the dielectric layer 113, as shown in FIG. 2 in accordance with some embodiments. After the planarization process, a conductive structure 169 including the barrier layer 163 and the conductive layer 165 is formed over the polysilicon stack 149 and surrounded by the dielectric layer 113. The respective step is illustrated as the step S41 in the method 10B shown in FIG. 5.

The planarization process may include a CMP process, a grinding process, an etch back process, or the like. In some embodiments, the top surface 113T of the dielectric layer 113 is higher than the top surface 163T of the barrier layer 163 and the top surface 165T of the conductive layer 165 after the planarization process. In some embodiments, the top surface 113T of the dielectric layer 113 is substantially coplanar with the top surface 163T of the barrier layer 163 and the top surface 165T of the conductive layer 165 after the planarization process. After the conductive structure 169 is formed, the semiconductor device 100B is obtained.

Since the polysilicon stack 149 having undoped polysilicon layers (i.e., the first polysilicon layer 141 and the third polysilicon layer 145) and doped polysilicon layers (i.e., the second polysilicon layer 143 and the fourth polysilicon layer 147) interlaced with each other is formed between the source/drain structure 111 and the contact structure 169, the contact resistance may be reduced. As a result, the device performance of the semiconductor device 100B may be enhanced.

Figure 23:
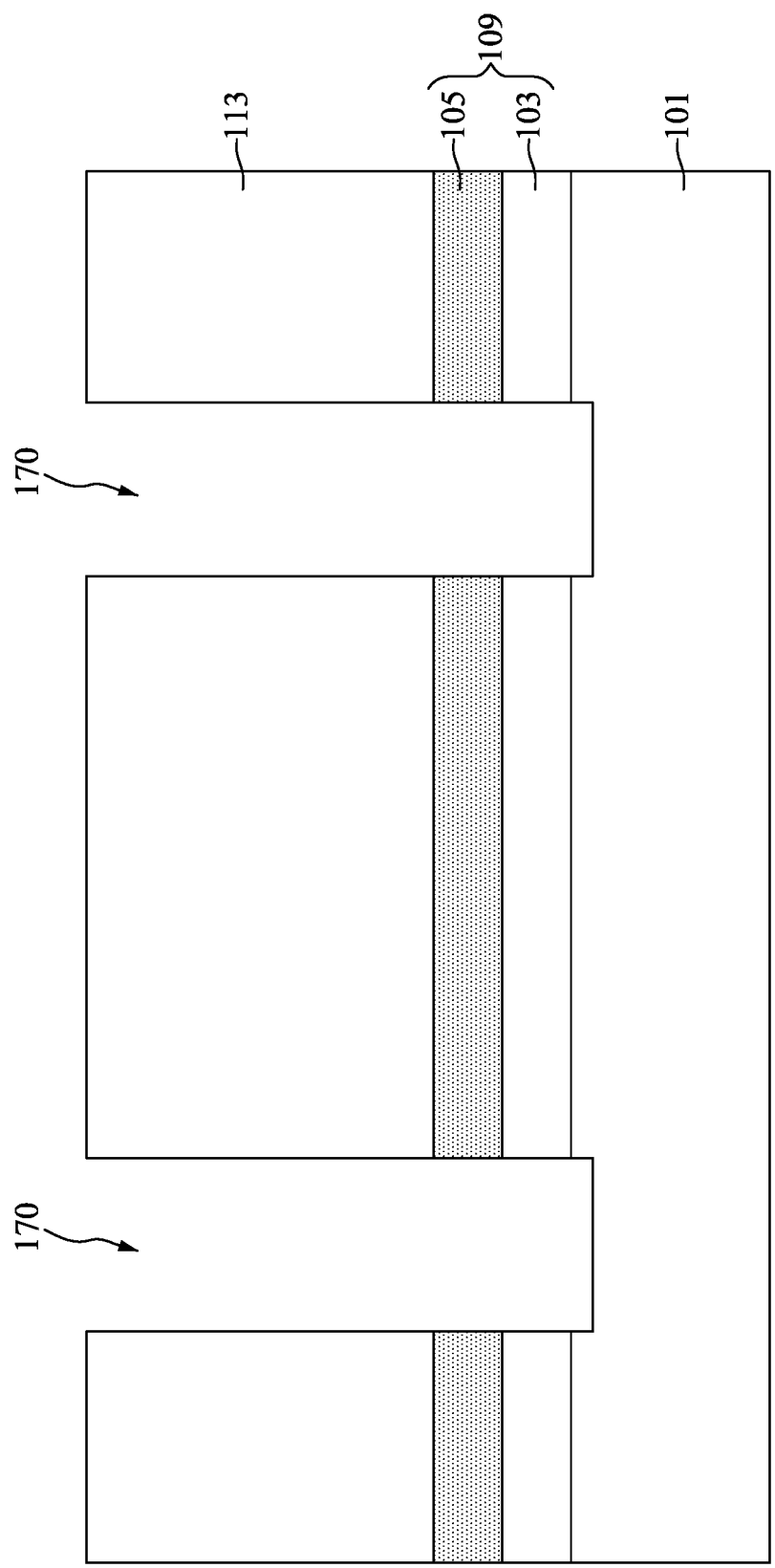
FIG. 23 is a cross-sectional view illustrating an intermediate stage of forming openings penetrating through the dielectric layer, the silicide layer, and the epitaxial layer during the formation of the semiconductor device, in accordance with some embodiments.
Figure 24:
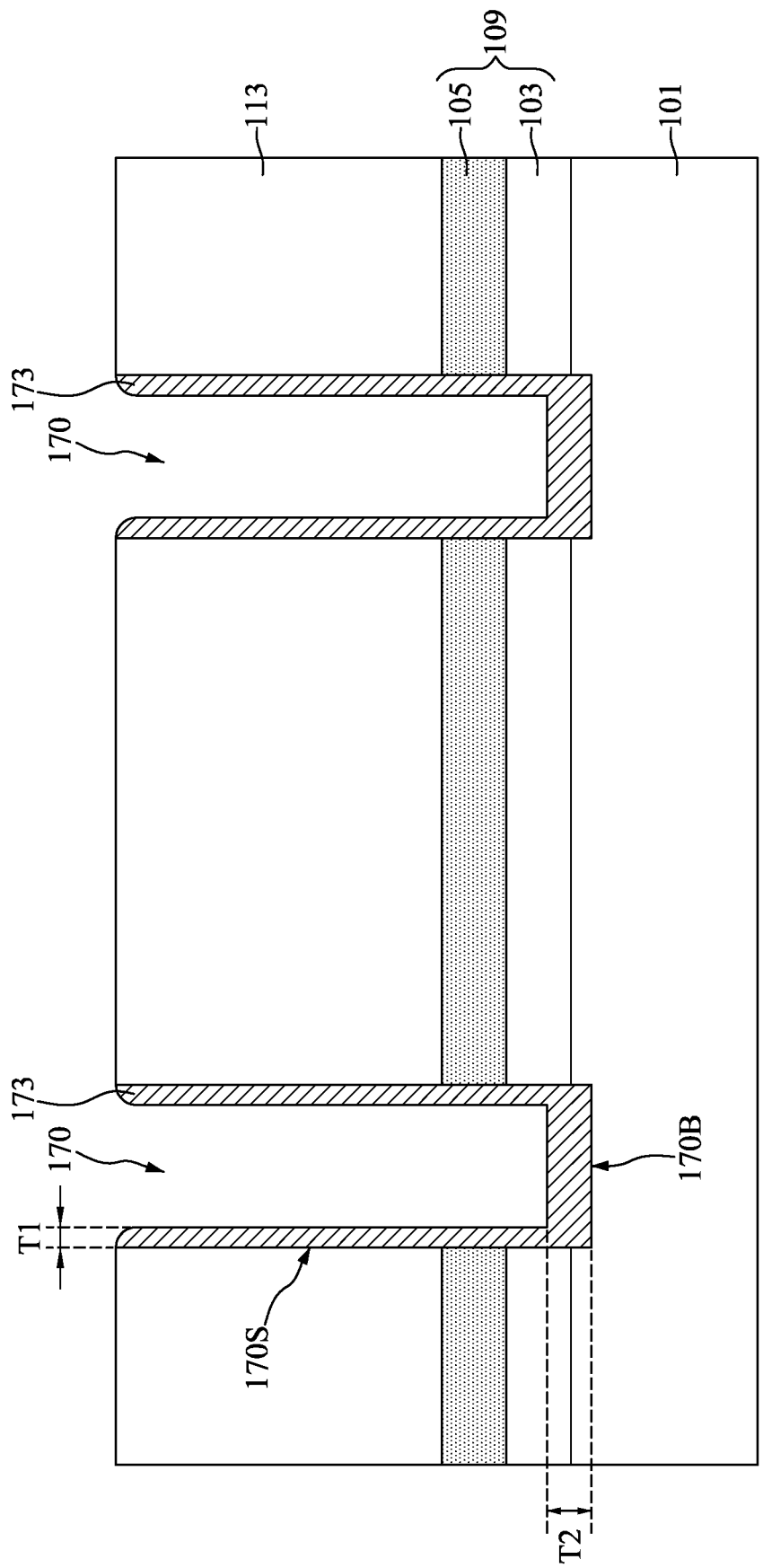
FIG. 24 is a cross-sectional view illustrating an intermediate stage of forming barrier layers lining the openings during the formation of the semiconductor device, in accordance with some embodiments.

FIGS. 23 and 24 illustrate intermediated stages of forming the semiconductor device 100C continued from the step similar to the step shown in FIG. 7, in accordance with some embodiments. As shown in FIG. 23, the source/drain structure 109 including the epitaxial layer 103 and the silicide layer 105 is formed over the semiconductor substrate 101, and the dielectric layer 113 is formed over the source/drain structure 109. The respective steps are illustrated as the steps S51 and S53 in the method 10C shown in FIG. 6. Some materials and processes used to form the epitaxial layer 103, the silicide layer 105 and the dielectric layer 113 in the semiconductor device 100C are similar to, or the same as those used to form the epitaxial layer 103, the silicide layer 105 and the dielectric layer 113 in the semiconductor device 100A and details thereof are not repeated herein.

Still referring to FIG. 23, openings 170 are formed penetrating through the dielectric layer 113 and the source/drain structure 109, in accordance with some embodiments. The respective step is illustrated as the step S55 in the method 10C shown in FIG. 6. Some processes used to form the openings 170 in the semiconductor device 100C are similar to, or the same as those used to form the opening 120 (see FIG. 8) in the semiconductor device 100A and details thereof are not repeated herein. In some embodiments, the openings 170 extend into the upper portion of the semiconductor substrate 101.

Next, an anisotropic deposition process is performed to form barrier layers 173 covering the sidewalls 170S and the bottom surfaces 170B of the openings 170, as shown in FIG. 24 in accordance with some embodiments. The respective step is illustrated as the step S57 in the method 10C shown in FIG. 6. In some embodiments, the barrier layers 173 include titanium (Ti), titanium nitride (TiN), or a combination thereof. In some embodiments, the anisotropic deposition process is performed so as to ensure that the first thicknesses T1 of the barrier layers 173 on the sidewalls 170S of the openings 170 are less than the second thicknesses T2 of the barrier layers 173 on the bottom surfaces 170B of the openings 170. In some embodiments, the anisotropic deposition process includes a physical vapor deposition (PVD) process.

Subsequently, conductive layers 175 are formed in the remaining portions of the openings 170 over the barrier layers 173, and conductive structures 179 including the barrier layers 173 and the conductive layers 175 are formed, as shown in FIG. 3 in accordance with some embodiments. The respective step is illustrated as the step S59 in the method 10C shown in FIG. 6. In some embodiments, the conductive layers 175 include tungsten (W). Moreover, the conductive layers 179 may be formed by a deposition process, and a subsequent planarization process. After the conductive structures 179 are formed, the semiconductor device 100C is obtained.

Since the first thicknesses T1 of the barrier layers 173 are less than the second thicknesses T2 of the barrier layers 173, the barrier layers 173 can be prevented from overhanging at the top corners of the openings 170, which is beneficial for forming void-free conductive layers 175. As a result, a device performance of the semiconductor device 100C may be enhanced.

Embodiments of the semiconductor devices 100A, 100B and 100C, and method for preparing the same are provided in the disclosure. In some embodiments, each of the semiconductor devices 100A and 100B includes a polysilicon stack (e.g., the polysilicon stacks 139 and 149) disposed over a source/drain structure (e.g., the source/drain structures 109 and 111), and a contact structure (e.g., the contact structures 159 and 169) disposed directly over the polysilicon stack. The polysilicon stack includes an undoped polysilicon layer (e.g., the polysilicon layers 133, 141 and 145) and a doped polysilicon layer (e.g., the polysilicon layers 135, 143 and 147) disposed over the undoped polysilicon layer. By forming the polysilicon stack between the contact structure and the source/drain structure, contact resistance may be reduced, and this improves device performance.

In some embodiments, the semiconductor device 100C includes a conductive structure (e.g., the conductive structures 179) having a barrier layer (e.g., the barrier layers 173) and a conductive layer (e.g., the conductive layers 175) disposed over and surrounded by the barrier layer. The barrier layer has a first thickness on the sidewall of the conductive layer, and a second thickness under the bottom surface of the conductive layer. Since the first thickness is less than the second thickness, the conductive layer can be formed void-free, and this improves device performance.

In one embodiment of the present disclosure, a semiconductor device is provided. The semiconductor device includes a source/drain structure disposed over a semiconductor substrate, and a dielectric layer disposed over the source/drain structure. The semiconductor device also includes a polysilicon stack disposed over the source/drain structure and surrounded by the dielectric layer. The polysilicon stack includes a first polysilicon layer and a second polysilicon layer disposed over the first polysilicon layer. The first polysilicon layer is undoped, and the second polysilicon layer is doped. The semiconductor device further includes a contact structure disposed directly over the polysilicon stack and surrounded by the dielectric layer.

In another embodiment of the present disclosure, a semiconductor device is provided. The semiconductor device includes a source/drain structure disposed over a semiconductor substrate, and a dielectric layer disposed over the source/drain structure. The semiconductor device also includes a contact structure penetrating through the dielectric layer and the source/drain structure. The contact structure includes a conductive layer and a barrier layer covering a sidewall and a bottom surface of the conductive layer. A first thickness of the barrier layer on the sidewall of the conductive layer is less than a second thickness of the barrier layer under the bottom surface of the conductive layer.

In another embodiment of the present disclosure, a method for preparing a semiconductor device is provided. The method includes forming an epitaxial layer over a semiconductor substrate, and forming a dielectric layer over the epitaxial layer. The method also includes etching the dielectric layer to form an opening, and forming a polysilicon stack in the opening, the step of forming the polysilicon stack includes forming a first polysilicon layer, and forming a second polysilicon layer over the first polysilicon layer. The first polysilicon layer is undoped, and the second polysilicon layer is doped. The method further includes forming a contact structure in the opening and over the polysilicon stack.

In yet another embodiment of the present disclosure, a method for preparing a semiconductor device is provided. The method includes forming a source/drain structure over a semiconductor substrate, and forming a dielectric layer over the source/drain structure. The method also includes etching the dielectric layer and the source/drain structure to form an opening, and forming a conductive contact in the opening. The step of forming the conductive contact includes performing an anisotropic deposition process to form a barrier layer covering a sidewall and a bottom surface of the opening, and filling a remaining portion of the opening with a conductive layer after the barrier layer is formed.

The embodiments of the present disclosure have some advantageous features. In some embodiments, by forming a polysilicon stack between the source/drain structure and the conductive structure, the contact resistance may be reduced, and the device performance may be improved. In some embodiments, by forming a conductive contact having a barrier layer with different thicknesses, a conductive layer formed over the barrier layer can be void-free, and the device performance may be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
   forming an epitaxial layer over a semiconductor substrate;
   forming a dielectric layer over the epitaxial layer;
   etching the dielectric layer to form an opening;
   forming a polysilicon stack in the opening, wherein the step of forming the polysilicon stack comprises:
      forming a first polysilicon layer, wherein the first polysilicon layer is undoped; and
      forming a second polysilicon layer over the first polysilicon layer, wherein the second polysilicon layer is doped; and
   forming a contact structure in the opening and over the polysilicon stack.

2. The method for preparing a semiconductor device of claim 1, further comprising:
   forming a gate structure penetrating through the dielectric layer and the epitaxial layer, wherein the gate structure extends into the semiconductor substrate, and the gate structure is formed before the opening is formed.

3. The method for preparing a semiconductor device of claim 1, wherein the step of forming the polysilicon stack further comprises:
   forming a third polysilicon layer over the second polysilicon layer, wherein the third polysilicon layer is undoped; and
   forming a fourth polysilicon layer over the third polysilicon layer, wherein the fourth polysilicon layer is doped.

4. The method for preparing a semiconductor device of claim 3, wherein a dopant concentration of the second polysilicon layer is greater than a dopant concentration of the fourth polysilicon layer.

5. The method for preparing a semiconductor device of claim 1, wherein the step of forming the contact structure comprises:
   forming a barrier layer lining the opening and over the polysilicon stack; and
   filling a remaining portion of the opening with a conductive layer after the barrier layer is formed, wherein the conductive layer is separated from the polysilicon stack by the barrier layer.

6. The method for preparing a semiconductor device of claim 1, further comprising:
   forming a silicide layer between the epitaxial layer and the dielectric layer before the opening is formed, wherein a top surface of the silicide layer is exposed by the opening before the polysilicon stack is formed.

7. The method for preparing a semiconductor device of claim 1, wherein a top surface of the epitaxial layer is exposed by the opening before the polysilicon stack is formed, and a silicide layer is formed between the epitaxial layer and the polysilicon stack during the forming of the first polysilicon layer.

* * * * *